United States Patent
Kato et al.

(10) Patent No.: US 8,514,309 B2
(45) Date of Patent: Aug. 20, 2013

(54) SOLID-STATE IMAGE SENSOR

(75) Inventors: Taro Kato, Kawasaki (JP); Akinari Takagi, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 358 days.

(21) Appl. No.: 13/123,917

(22) PCT Filed: May 19, 2010

(86) PCT No.: PCT/JP2010/058851
§ 371 (c)(1),
(2), (4) Date: Apr. 13, 2011

(87) PCT Pub. No.: WO2010/134626
PCT Pub. Date: Nov. 25, 2010

(65) Prior Publication Data
US 2011/0199521 A1 Aug. 18, 2011

(30) Foreign Application Priority Data

May 21, 2009 (JP) ................................. 2009-123589
Jul. 15, 2009 (JP) ................................. 2009-166775

(51) Int. Cl.
*H04N 3/14* (2006.01)
*H04N 5/335* (2011.01)
*H04N 5/225* (2006.01)

(52) U.S. Cl.
USPC .......................................... 348/294; 348/340

(58) Field of Classification Search
None
See application file for complete search history.

(56) References Cited

U.S. PATENT DOCUMENTS

| 7,135,666 B2* | 11/2006 | Dobashi ..................... 250/208.1 |
| 7,728,278 B2* | 6/2010 | Roy et al. ....................... 348/340 |
| 8,229,255 B2* | 7/2012 | Wober ............................. 385/12 |
| 2006/0278948 A1 | 12/2006 | Yamaguchi et al. ........... 257/444 |
| 2007/0280587 A1* | 12/2007 | Makita ............................ 385/14 |
| 2009/0020690 A1 | 1/2009 | Toda ........................... 250/227.2 |
| 2010/0178018 A1* | 7/2010 | Augusto ........................ 385/131 |
| 2011/0079867 A1 | 4/2011 | Numata et al. ................ 257/432 |

FOREIGN PATENT DOCUMENTS

| EP | 1 793 247 A | 6/2007 |
| JP | 06-224398 A | 8/1994 |
| JP | 2008-041847 A | 2/2008 |
| WO | WO 2009/030980 A2 | 3/2009 |

OTHER PUBLICATIONS

International Preliminary Report on Patentability dated Dec. 1, 2011, in International Application No. PCT/JP2010/058851 filed May 19, 2010.

\* cited by examiner

*Primary Examiner* — Sinh Tran
*Assistant Examiner* — Jason Flohre
(74) *Attorney, Agent, or Firm* — Fitzpatrick, Cella, Harper & Scinto

(57) ABSTRACT

A solid-state image sensor comprises a pixel unit having a substrate including therein a photoelectric conversion section and an optical waveguide arranged on a light incident side of the substrate so as to guide an incident light converted into a guided mode of the optical waveguide and being propagated through the optical waveguide to the photoelectric conversion section. The optical waveguide has a mode conversion section for changing a propagation state of the incident light such that the incident light being propagated through the optical waveguide has an electric field amplitude distributed with the same sign at a light incident surface of the substrate.

9 Claims, 15 Drawing Sheets

(a) ZERO-ORDER MODE — A0(x) — EVEN MODE
(b) SECOND-ORDER MODE — A2(x) — EVEN MODE
(c) FIRST-ORDER MODE — A1(x) — ODD MODE

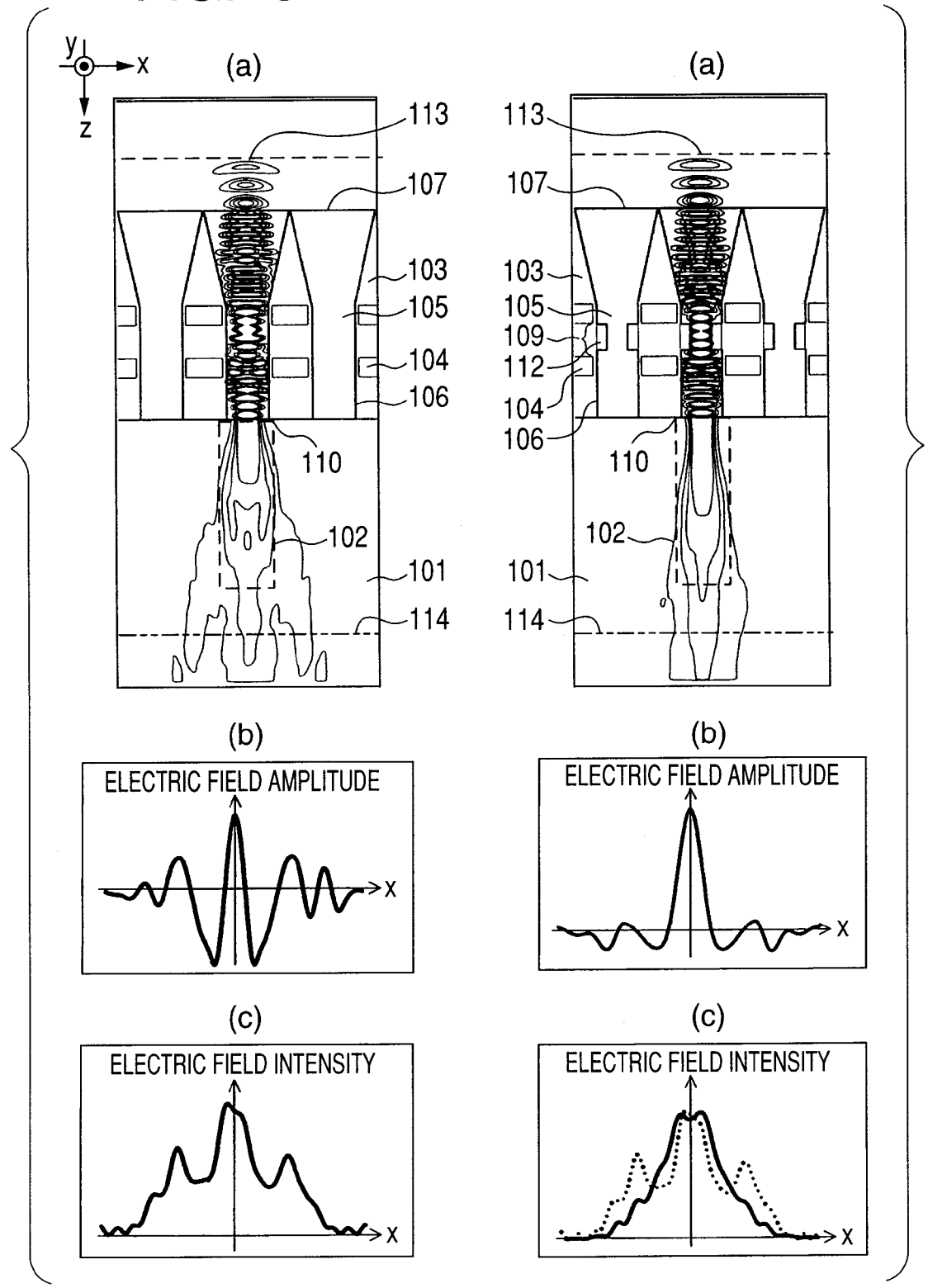

FIG. 7A
(a)
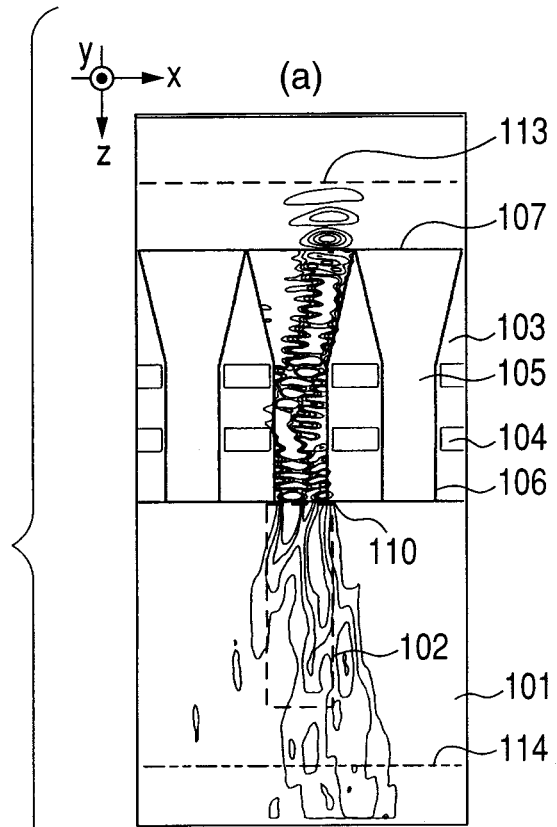
(b)
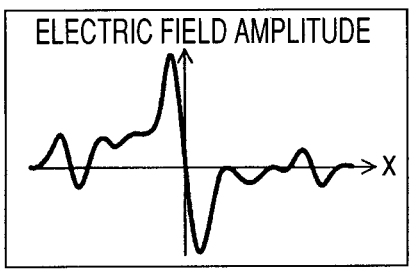
(c)
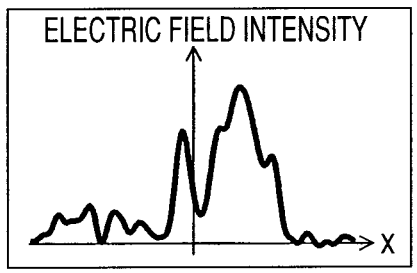
FIG. 7B
(a)
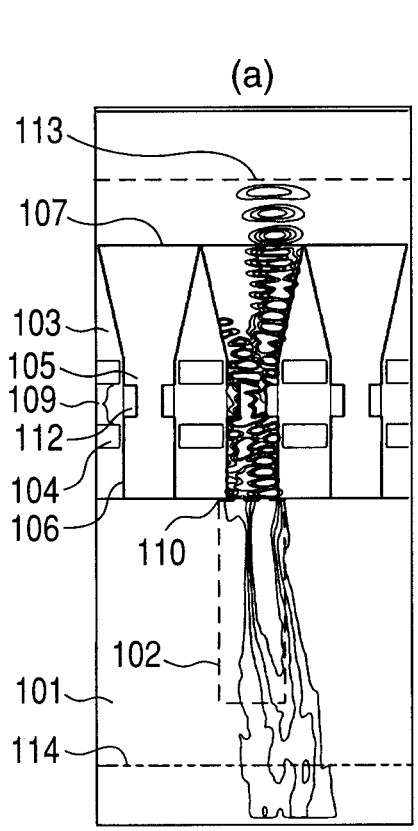
(b)
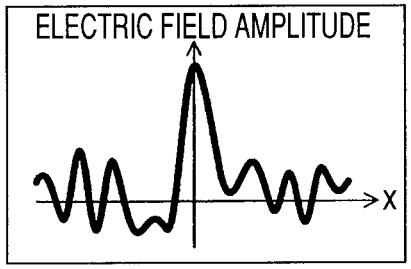
(c)
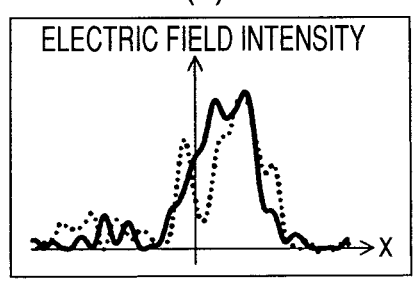

(a) EVEN MODE (b) ODD MODE

FIG. 11A
(a)
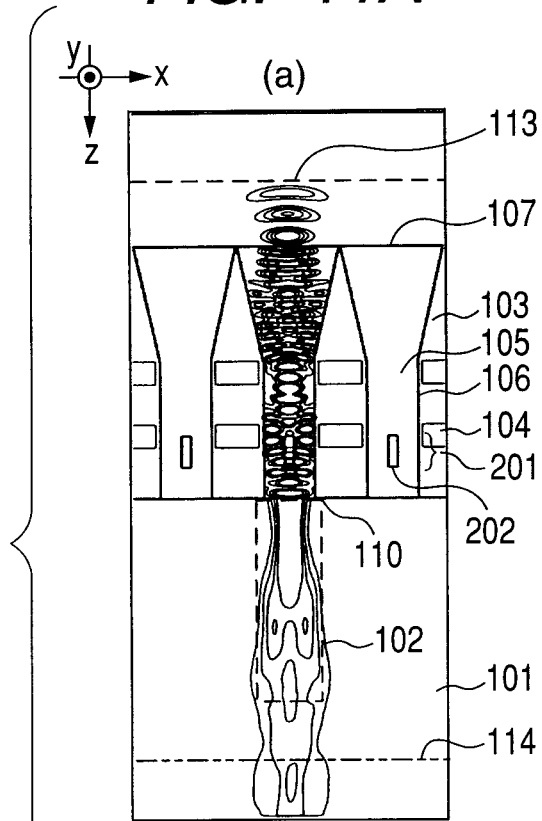
(b)
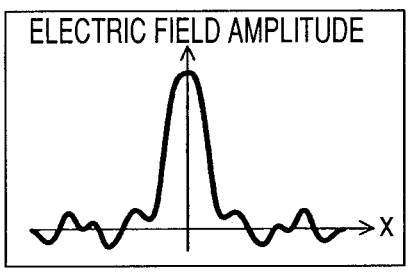
(c)
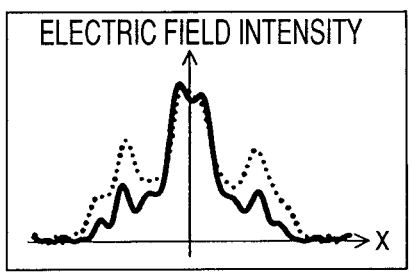
FIG. 11B
(a)
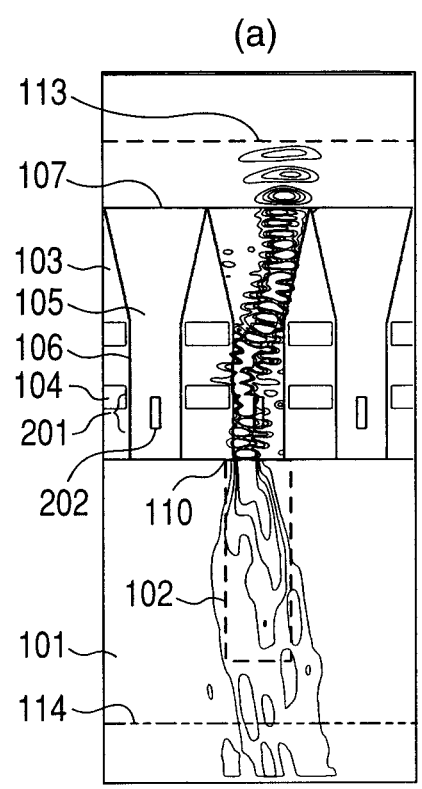
(b)
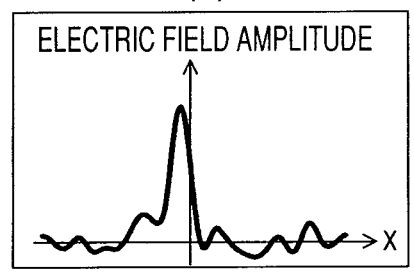
(c)
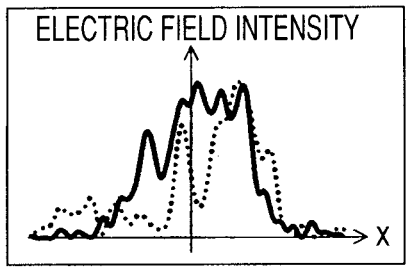

FIG. 14A
FIG. 14B
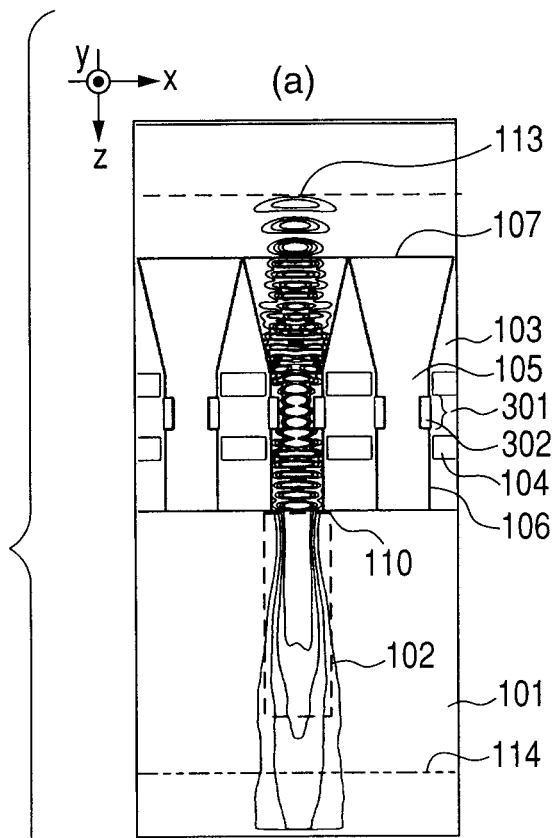
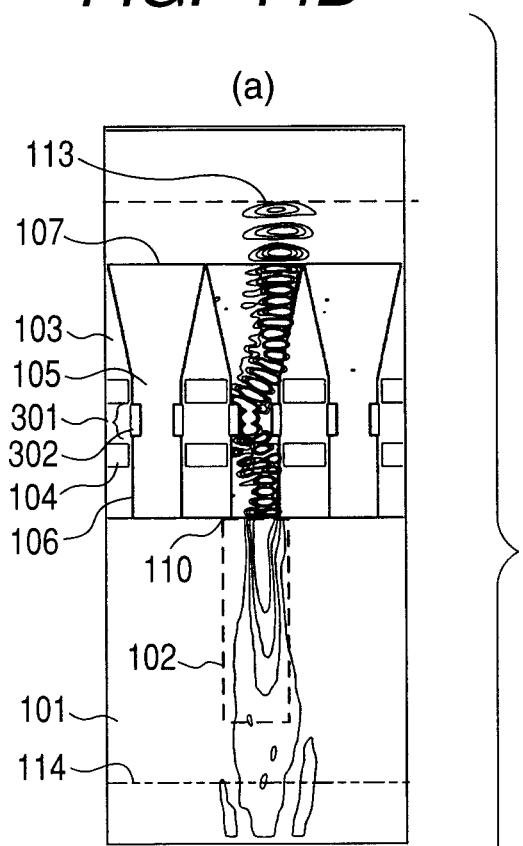
(a)
(b)
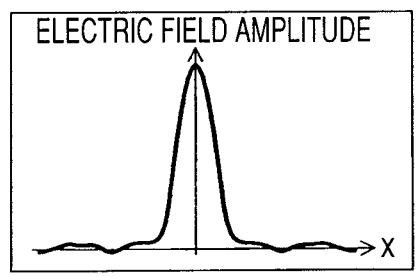
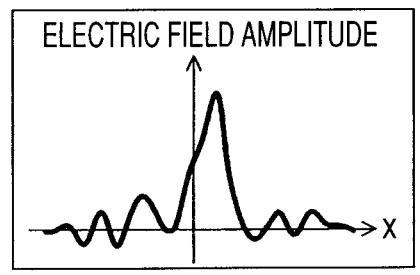
ELECTRIC FIELD AMPLITUDE
(c)
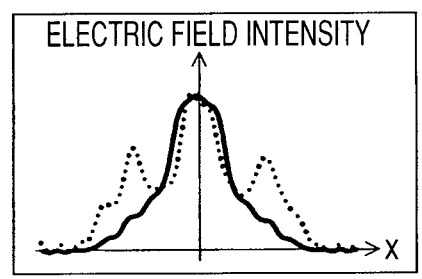
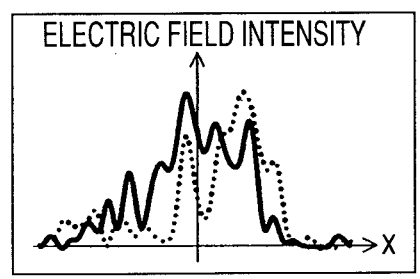
ELECTRIC FIELD INTENSITY

SOLID-STATE IMAGE SENSOR

TECHNICAL FIELD

The present invention relates to a solid-state image sensor. More particularly, the present invention relates to a solid-state image sensor to be suitably used for a digital video camera or a digital still camera.

BACKGROUND ART

The size of each pixel of solid-state image sensors being used in digital video cameras and digital still cameras has been downsized year by year as the number of pixels of such a camera has been increased. As a result, the area of the photoelectric conversion section of the camera has been reduced, and the aspect ratio (depth/width) of the pixel structure has been raised. As the area of the photoelectric conversion section is reduced, there arises a problem of reduction in light receiving sensitivity. As the aspect ratio of the pixel structure is raised, there arise concerns that the F-value of the on-chip lens rises to reduce the focusing efficiency and produce a problem of crosstalk of light leaking to adjacent pixels.

To date, solid-state image sensors having an optical waveguide as disclosed in Japanese Patent Application Laid-Open No. H06-224398 have been proposed as means for solving the above-identified problems. A known solid-state image sensor having an optical waveguide will be described by referring to the accompanying drawings. The solid-state image sensor includes a plurality of pixel units 400 arranged in the form of a matrix. FIG. 15A schematically illustrates a cross-sectional view of a known pixel unit 400. The pixel unit 400 includes a silicon substrate 1101, a photoelectric conversion section 1102 arranged in the silicon substrate 1101 and a clad section 1103 formed of a transparent material on the silicon substrate 1101. A wiring section 1104 is formed in the inside of the clad section 1103 at a predetermined position on the silicon substrate 1101. Additionally, a core section 1105 is embedded in the inside of the clad section 1103 on the photoelectric conversion section 1102 to form an optical waveguide 1106. A refractive index of the core section 1105 is higher than that of the clad section 1103. A tapered light incident section 1108 is arranged on the optical waveguide 1106 so as to gradually increase its width toward the light incident surface 1107 and a color filter 1111 is formed in the inside of the light incident section 1108. With the solid-state image sensor having such a configuration, light entering it from the light incident surface 1107 of the light incident section 1108 can be converted into the guided mode that the optical waveguide 1106 possesses and converged to the core section 1105 for propagation. As a result, light can be guided efficiently to the silicon substrate surface 1110, while being protected against the crosstalk that arises above the silicon substrate 1101.

Japanese Patent Application Laid-Open No. 2008-41847 proposes a method of suppressing the spread of light in the transversal direction in the inside of a silicon substrate by means of an arrangement as described below. Namely, the spread of light in the transversal direction in the inside of a silicon substrate 1101 is suppressed by arranging a halftone light-shielding film on a silicon substrate 1110 to thereby invert the phase of the skirt section of incident light and suppress the spread of the electric field intensity distribution on the silicon substrate surface 1110.

DISCLOSURE OF THE INVENTION

However, while the optical waveguide of FIG. 15A can efficiently guide light to the surface of the silicon substrate, it is accompanied by a problem that light spreads to adjacent pixel regions under the influence of diffraction in the inside of the silicon substrate to give rise to crosstalk. FIG. 15B is a graph showing the penetration depth (propagation distance where the intensity falls to 1/e) relative to the wavelength. Occurrences of crosstalk are particularly apprehended at the long wavelength side because the intra-silicon penetration depth is about 4 μm at the long wavelength side where silicon shows a small absorption coefficient. It is difficult from the design point of view to provide a structure that optically separates adjacent pixels in the inside of a silicon substrate. Additionally, it is difficult to realize such a structure because it inevitably increases the noise level.

On the other hand, the method disclosed in the above-cited Japanese Patent Application Laid-Open No. 2008-41847 cannot suppress the spread of light being propagated in the inside of the silicon substrate 1101 in the transversal direction. This method suppresses the spread of the electric field intensity distribution of the spot of light focused by a lens by means of a phase shift mask of the type that is being popularly employed in the field of lithography technology to raise the resolution. However, such means cannot reduce the angle of diffraction of light being transmitted through the mask. Rather, with the method of the above-cited Japanese Patent Application Laid-Open No. 2008-41847, the spreading angle of light being propagated in the inside of the silicon substrate 1101 is increased to further spread light in the transversal direction when the electric field amplitude distribution shows positive regions and negative regions that are intermingled on the silicon substrate surface 1101. When a structure is arranged on the silicon substrate surface 1110, it can damage the photoelectric conversion section 1102 to give rises to a problem of producing noises.

In view of the above-identified circumstances, the object of the present invention is to provide a solid-state image sensor that can suppress the crosstalk produced on and in a silicon substrate and shows an excellent color reproducibility and high definition capabilities.

According to the present invention, there is provided a solid-state image sensor including a pixel having a substrate including a photoelectric conversion section in the inside and an optical waveguide arranged at the light incident side of the substrate so as to lead the incident light converted into the guided mode of the optical waveguide and being propagated through the optical waveguide to the photoelectric conversion section, characterized in that the optical waveguide has a mode conversion section for changing the propagation state of the incident light and the electric field amplitude of the incident light being propagated through the optical waveguide is distributed with the same sign on the light incident side surface of the substrate.

Thus, according to the present invention, it is possible to realize a solid-state image sensor that can suppress the crosstalk produced on and in a silicon substrate and shows an excellent color reproducibility and high definition capabilities.

BRIEF DESCRIPTION OF THE DRAWINGS

FIG. 1B illustrates a modified embodiment.

FIGS. 2A and 2B also illustrate the electric field amplitude distribution on the silicon substrate surface and the electric field intensity distribution of light being propagated in the inside of the silicon substrate.

Each of FIGS. 6A and 6B illustrates (a) the xz cross section of the electric field intensity distribution, (b) the electric field amplitude distribution on the silicon substrate surface and (c) the electric field intensity distribution on the evaluation plane for a numerical example (of light entering from the center of the incident light surface) according to Embodiment 1 of the present invention.

Each of FIGS. 7A and 7B illustrates (a) the xz cross section of the electric field intensity distribution, (b) the electric field amplitude distribution on the silicon substrate surface and (c) the electric field intensity distribution on the evaluation plane for a numerical example (of light entering from an end of the incident light surface) according to Embodiment 1 of the present invention.

FIGS. 8A, 8B, 8C, 8D, 8E, 8F, 8G and 8H are schematic cross-sectional views of Embodiment 1, illustrating the process of manufacturing a solid-state image sensor including a pixel unit.

Figure 9A:
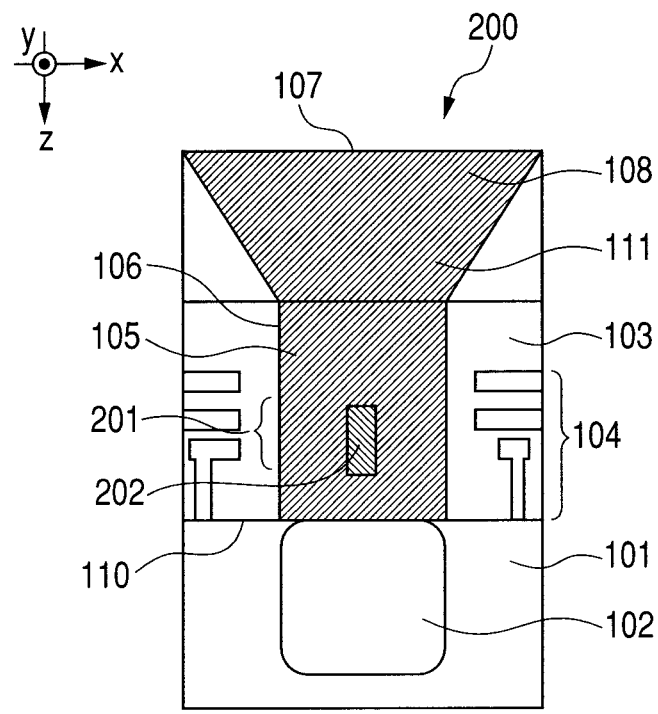
Figure 9B:
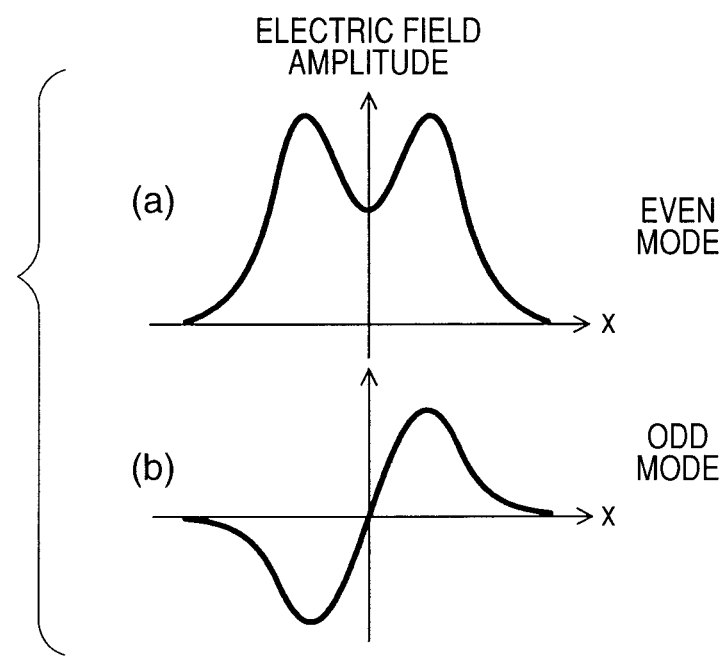

FIG. 9A schematically illustrates the xz cross section of a pixel unit according to Embodiment 2 of the present invention. FIG. 9B is a schematic illustration of the eigenmodes of a region where a mode conversion section is added in Embodiment 2 of the present invention.

Figure 10A:
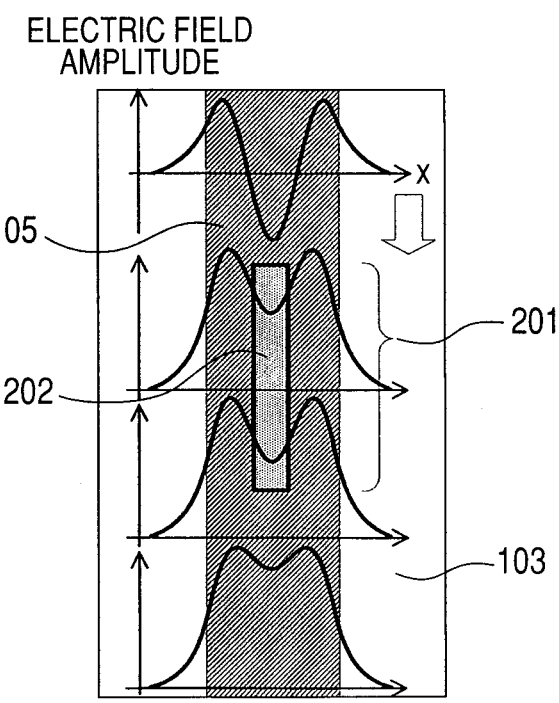
Figure 10B:
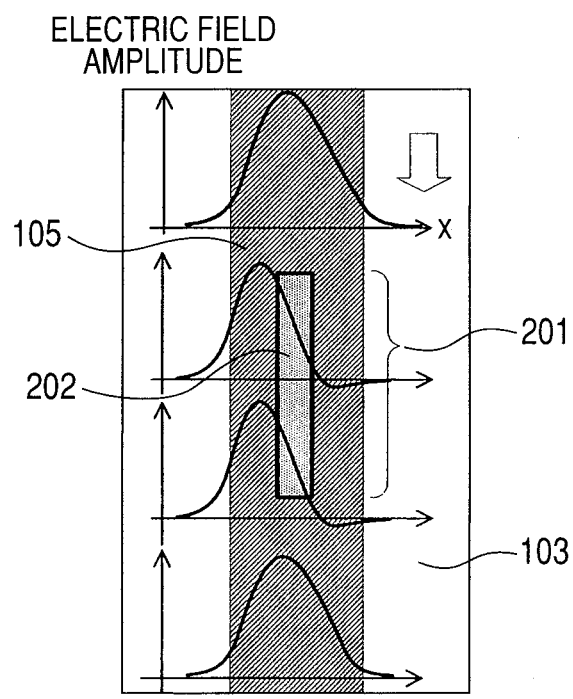

FIGS. 10A and 10B are schematic illustrations of the guided mode for propagation through the optical waveguide where a mode conversion section is added of Embodiment 2 of the present invention.

Each of FIGS. 11A and 11B illustrates (a) the xz plane of the electric field intensity distribution, (b) the electric field amplitude distribution on the silicon substrate surface and (c) the electric field intensity distribution on the evaluation plane for a numerical example of Embodiment 2.

Figure 12A:
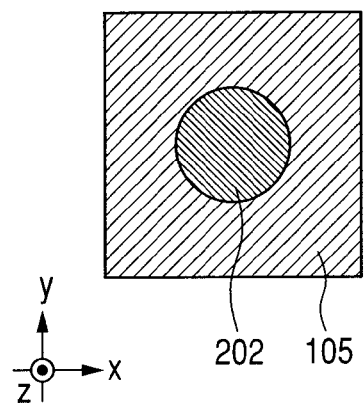
Figure 12B:
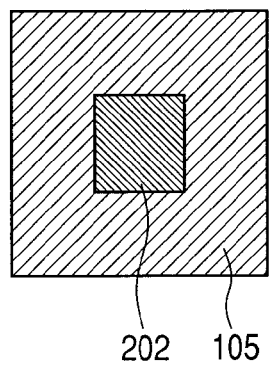
Figure 12C:
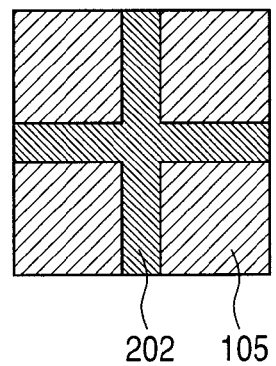

FIGS. 12A, 12B and 12C schematically illustrate the xz plane of the mode conversion section according to Embodiment 2 of the present invention.

Figure 13A:
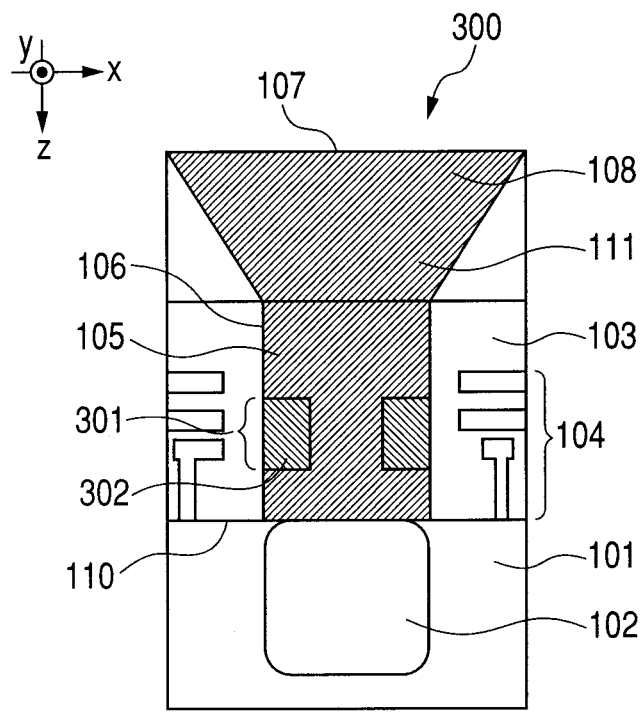
Figure 13B:
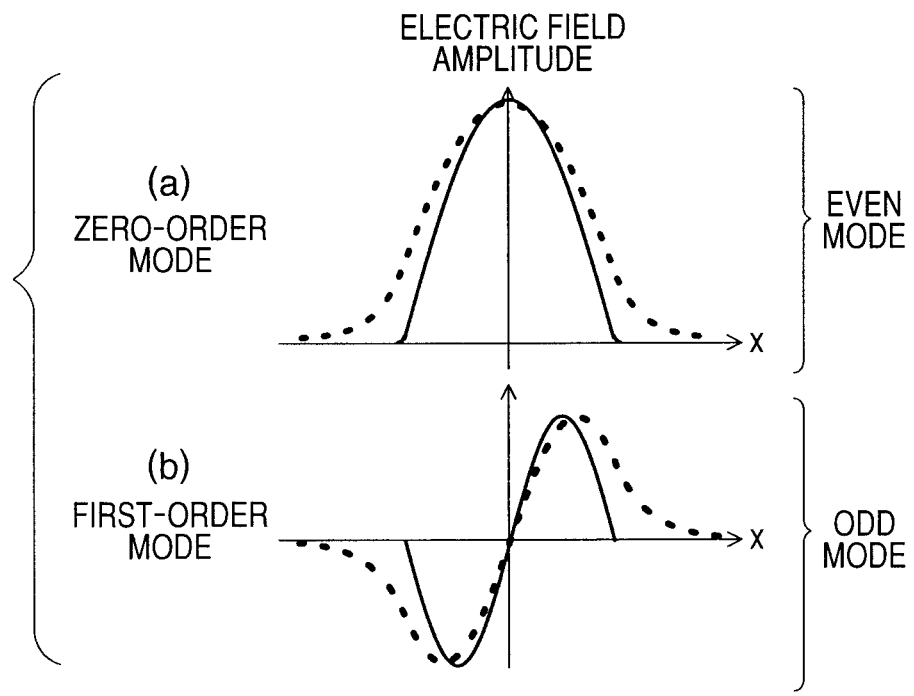

FIG. 13A schematically illustrates the xz cross section of a pixel unit of Embodiment 3 of the present invention. FIG. 13B is a schematic illustration of the eigenmodes of a region where a mode conversion section is added in Embodiment 3 of the present invention.

Each of FIGS. 14A and 14B illustrates (a) the xz cross section of the electric field intensity distribution, (b) the electric field amplitude distribution on the silicon substrate surface and (c) the electric field intensity distribution on the evaluation plane for a numerical example according to Embodiment 3 of the present invention.

Figure 15A:
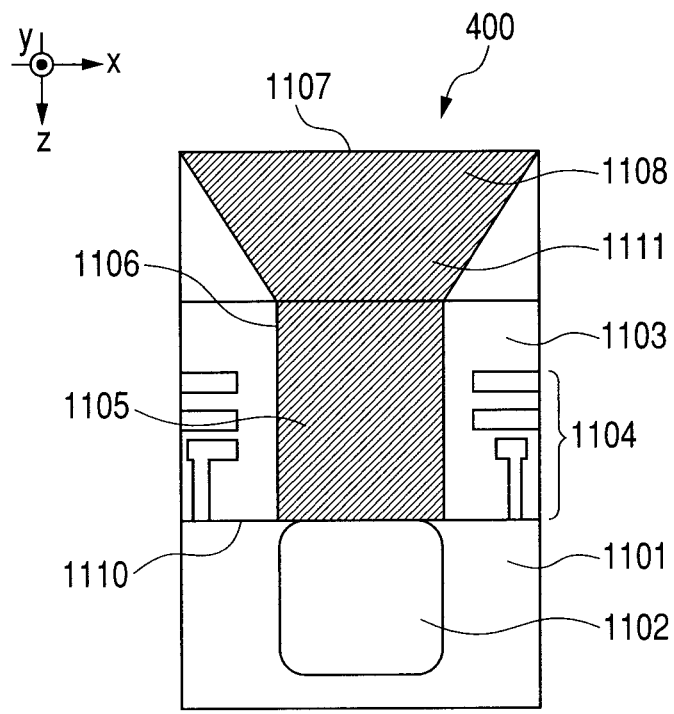
Figure 15B:
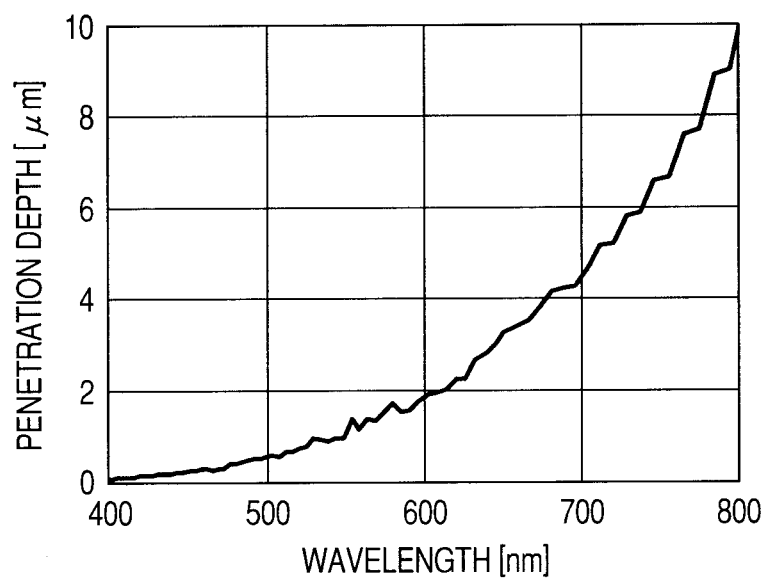

FIG. 15A schematically illustrates the xz cross section of a pixel unit of a conventional example. FIG. 15B is a graph schematically illustrating the penetration depth of a silicon substrate relative to the wavelength.

BEST MODE FOR CARRYING OUT THE INVENTION

Now, the present invention will be described in higher detail by referring to the accompanying drawings that illustrate embodiments of solid-state image sensor according to the present invention. Throughout the drawings illustrating the embodiments, the components having a same function are denoted by a same reference symbols and will not be described repeatedly.

Embodiment 1

The solid-state image sensor of Embodiment 1 of the present invention will be described by referring to FIG. 1A. The solid-state image sensor of this embodiment includes pixel units having a substrate including a photoelectric conversion section in the inside and an optical waveguide arranged at the light incident side of the substrate so as to lead incident light converted into the guided mode that the optical waveguide possesses and being propagated through the optical waveguide to the photoelectric conversion section.

More specifically, the solid-state image sensor of this embodiment includes a plurality of pixel units 100 arranged to form a matrix. Each of the pixel units 100 has a silicon substrate 101 and a photoelectric conversion section 102 arranged in the inside of the silicon substrate 101. Additionally, the pixel unit 100 has a clad section (interlayer insulating section) 103 formed of a transparent material on the silicon substrate 101 and a wiring section 104 formed at a predetermined position in the inside of the clad section 103.

A core section (high refractive index section) 105 formed of a transparent material is embedded in the clad section 103 on the silicon substrate 101 to form an optical waveguide 106. A refractive index of the core section 105 is higher than that of the clad section 103. A tapered light incident section 108 is arranged on the optical waveguide 106 so as to gradually increase a width thereof toward the light incident surface 107 and a color filter 111 having a red-light transmitting band is formed in the inside of the light incident section 108. A mode conversion section 109 is arranged with its mode conversion structure 112 held in contact with the lateral wall of the core section 105 in the inside of the latter.

The mode conversion structure 112 may be formed by a member having a refractive index that is different from the core section 105. Note, however, that the refractive index of the mode conversion structure 112 is lower than that of the core section 105. Also note that the mode conversion section 109 may be expressed as being formed by a region of the core section 105 produced by partly reducing the width of the core section 105. The distance between the end of the mode conversion section 109 at the side of the silicon substrate surface 110 and the silicon substrate surface 110 is indicated by L.

Figure 1A:
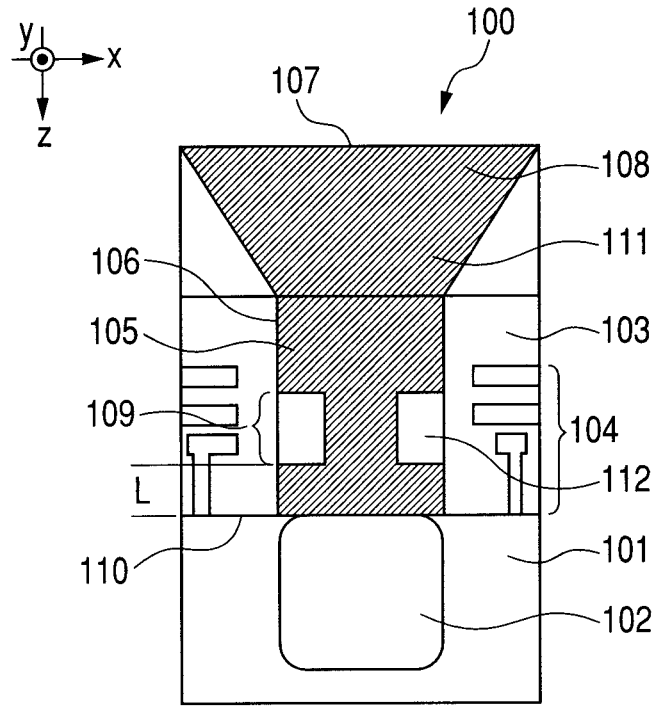
FIGS. 1A and 1B are schematic illustrations of the xz cross section of a pixel unit according to Embodiment 1 of the present invention.

Light enters the pixel unit 100 at the incident surface 107, converted into the guided mode of the optical waveguide 106 and propagated in the lower direction of FIG. 1A. The direction of the z-axis is made to agree with the direction in which light is propagated. A plane perpendicular to the z-axis is referred to as xy plane. FIG. 1A illustrates the xz cross section. The x-directional length of each part of the pixel unit is expressed as "width", whereas the z-direction length is expressed as "height". The axis passing through the center of the optical waveguide 106 and running in parallel with the z-axis is referred to as central axis. The optical waveguide 106 and the mode conversion section 109 are structurally symmetric relative to the central axis.

The clad section 103 is typically made of $SiO_2$ while the core section 105 is typically made of SiN. The mode conversion structure 112 is typically made of $SiO_2$. For instance, the refractive index of $SiO_2$ is about 1.46 and that of SiN is about 2.02 relative to light with a wavelength of 650 nm.

The concept of suppressing the spread of light in the transversal direction in the inside of the silicon substrate 101 will be described below. The spread of light in the inside of the silicon substrate 101 depends on the electric field amplitude distribution on the silicon substrate surface 110.

Figure 2A:
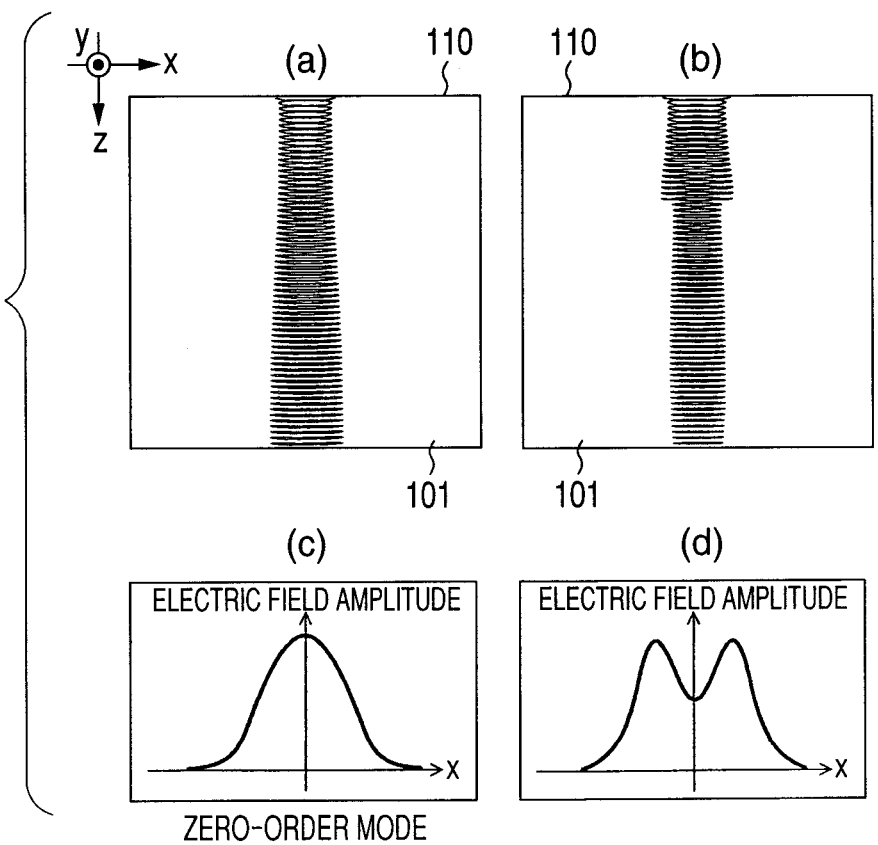
FIGS. 2A and 2B are schematic illustrations of the concept of the method of suppressing the spread of light in the transversal direction in the inside of the silicon substrate according to Embodiment 1 of the present invention.
Figure 2B:
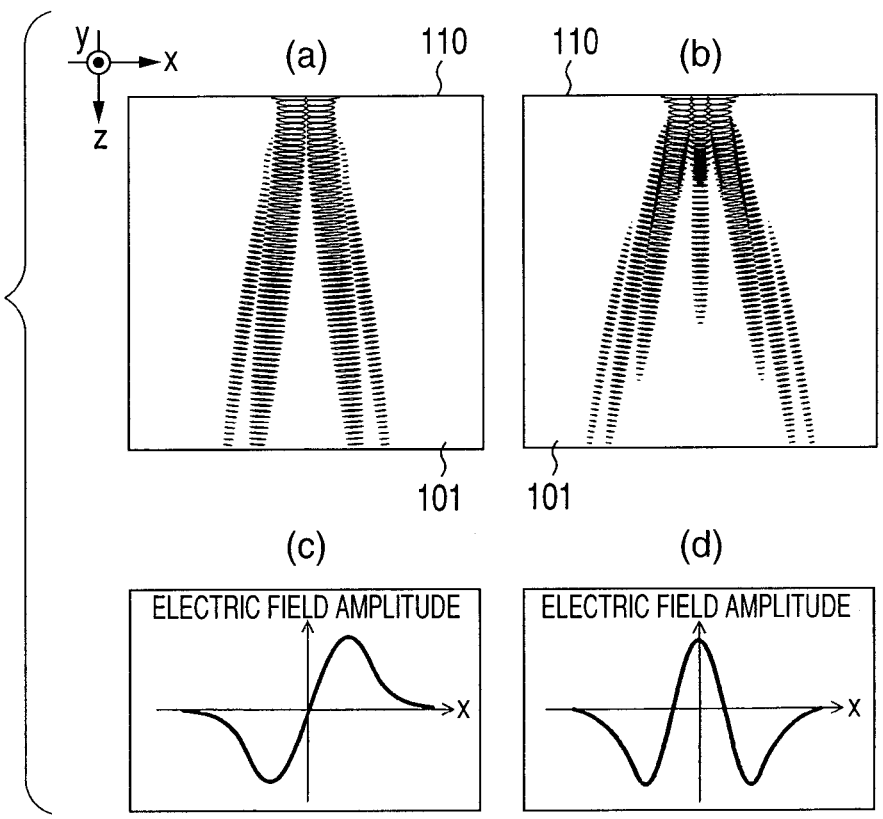

FIGS. 2A and 2B schematically illustrate the electric field amplitude distributions (c) and (d) that the light arriving at the silicon substrate surface 110 forms and the electric field intensity distributions (a) and (b) that the light produced when the light is propagated in the inside of the silicon substrate 101. It is assumed in (a)s and (b)s in FIGS. 2A and 2B that light is propagated from above toward below and the direction agrees with that of the z-axis. A plane perpendicular to the z-axis is referred to as xy plane.

In each of FIGS. 2A and 2B, (a) and (b) illustrates the xz cross section. In each of FIGS. 2A and 2B, the vertical axis of (c) and (d) indicates the electric field amplitude, whereas the horizontal axis indicates the coordinate value in the x-direction on the silicon substrate surface 110.

FIG. 2A illustrates an instance where the electric field amplitude formed by the light arriving at the silicon substrate surface 110 is distributed with the same sign. FIG. 2B illustrates an instance where positive regions and negative regions are intermingled in the electric field amplitude distribution on the silicon substrate surface 110. The expression that the electric field amplitude is distributed with the same sign means that not less than 90 percents of the signs of the electric field amplitude in the distribution are either positive or negative. The conditions under which the electric field amplitude is distributed with the same sign will be described in detail hereinafter. From FIGS. 2A and 2B, it will be seen that, when the electric field amplitude is distributed with the same sign on the silicon substrate surface 110, the spread of light in the transversal direction (x-direction) is suppressed in the inside of the silicon substrate 101.

Light enters the incident surface 107 at various positions thereof and light of wavelengths that are included in the transmission band of the color filter 111 is converted into the guided mode of the optical waveguide 106 for propagation. Therefore, it is difficult to make all the electric field amplitude of light arriving at the silicon substrate surface 110 is distributed with the same sign with the conventional structure where only an optical waveguide is provided as illustrated in FIG. 15A as a conventional example. Then, as a result, the light spreads in the transversal direction into the inside of the silicon substrate 101.

A method of fixing the profile of the guided mode to a single peaked profile and making the electric field distribution show the same sign on the silicon substrate surface 110 by selecting a single mode waveguide for the optical waveguide 106 may be conceivable. However, when a single mode waveguide is employed and the wavelength of incident light 650 nm while the core section 105 and the clad section 103 are made respectively of SiN and $SiO_2$, the width of the core section 105 of the optical waveguide 106 is required to be not greater than 200 nm. Therefore, the efficiency of converting incident light into the guided mode of the optical waveguide 106 will be low when a single mode waveguide is employed. More specifically, incident light is mostly reflected in the direction of the incident surface 107 at the interface of the incident section 108 and the optical waveguide 106 to reduce the transmission rate. Thus, a multimode waveguide needs to be selected for the optical waveguide 106 and the electric field amplitude needs to be distributed with the same sign on the silicon substrate surface 110 in order to raise the convergence efficiency. Any known method can hardly make these factors compatible.

It has been found that the above-identified problem can be solved by providing an arrangement of adding a mode conversion section 109 for changing the propagation state of light entering the optical waveguide 106 that is a multimode waveguide as illustrated in FIG. 1A. With such an arrangement, light entering the optical waveguide 106 from the incident surface 107 is efficiently converted into the guided mode of the optical waveguide 106 and propagated through the core section 105 in a concentrated manner. For this reason, light can be efficiently guided to the silicon substrate surface 110 while being protected against the crosstalk that arises above the silicon substrate 101. Additionally, the profile of the guided mode is deformed to define a specific profile by the mode conversion section 109 added to the optical waveguide 106 to control the electric field amplitude distribution so as to make it show the same sign on the silicon substrate surface 110.

The number of eigenmodes of the mode conversion section 109 is made not greater than two to define the profile of the guided mode for propagation through the mode conversion section 109. The electric field amplitude distribution on the silicon substrate surface 110 is made to show the same sign by appropriately selecting the refractive index and the profile of the mode conversion section 109 and the distance L from the silicon substrate surface 110 to the mode conversion section 109. Then, as a result, the spread of light in the transversal direction in the inside of the silicon substrate 101 can be suppressed to protect the light against the crosstalk that arises both above and inside the silicon substrate 101 to solve the above-identified problem.

Now, the method of making the electric field amplitude distribution show the same sign on the silicon substrate surface 110 will be described below from the relationship between the guided mode for propagation through the optical waveguide 106 and the mode conversion section 109 and the electric field amplitude distribution on the silicon substrate surface 110.

Firstly, the guided mode of the optical waveguide 106 will be described. The guided mode for propagation through the optical waveguide 106 is determined by the refractive index of the core section 105, the refractive index of the clad section 103 and the width of the core section 105.

Figure 3A:
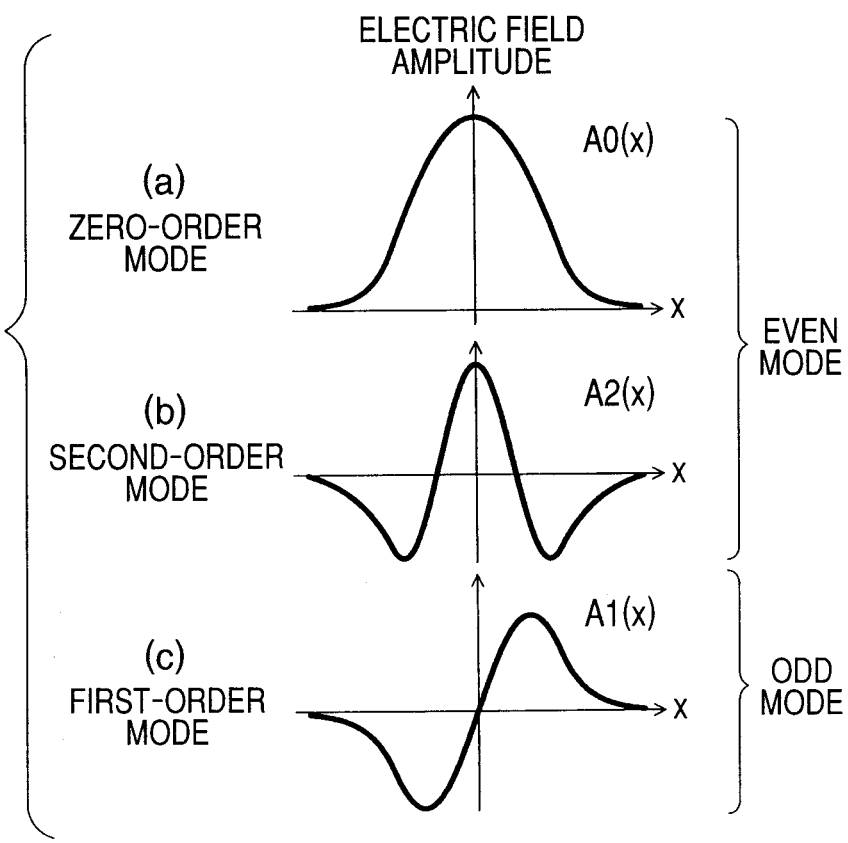
FIG. 3A is a schematic illustration of the eigenmodes of the optical waveguide according to Embodiment 1 of the present invention.

As an example, FIG. 3A illustrates the eigenmodes for propagation through the optical waveguide 106 when the wavelength of incident light in vacuum is 650 nm, the width of the core section 105 is 600 nm while the refractive index of the core section 105 and the refractive index of the clad section 103 are respectively 2.02 (SiN) and 1.46 ($SiO_2$). With these arrangements, there exist a total of three eigenmodes including a zero-order mode and a second-order mode that are symmetric relative to the central axis of the optical waveguide 106 (to be referred to as "even modes" hereinafter) and a first-order mode that is asymmetric relative to the central axis (to be referred to as "odd mode" hereinafter) on the xz plane of the optical wavelength 106. The normalized electric field amplitude distributions of the zero-order mode, the first-order mode and the second-order mode are expressed respectively as A0(x), A1(x) and A2(x).

Additionally, the propagation constants of the zero-order mode, the first-order mode and the second-order mode are expressed respectively as $\beta 0$, $\beta 1$ and $\beta 2$. $\beta 0$, $\beta 1$ and $\beta 2$ can be uniquely defined by the refractive index of the core section 105, the refractive index of the clad section 103 and the width of the core section 105 and have different respective values.

When actually preparing pixel unit, the width of the core section 105 of the optical waveguide 106 may give rise to partial fluctuations because of preparation errors. However, the propagation constant can be computationally determined by using the average value of the widths of the core section 105 in cross sections taken along the central axis of the optical waveguide 106.

Light can be concentrated to the core section 105 for propagation to prevent crosstalk from taking place above the silicon substrate 101 by making the refractive index of the core section 105 higher than the refractive index of the clad section 103 for the optical waveguide 106.

Now, the relationship between the guided mode for propagation through the optical waveguide 106 and the electric field amplitude distribution on the silicon substrate surface 110 of a conventional structure where only an optical waveguide 106 is provided and that does not employ any mode conversion section 109 will be described below.

The guided mode E(x,z) of the optical waveguide 106 in which light is propagated in the z-direction in the xz plane can be expressed by superposing the eigenmodes as shown below:

$$E(x,z)=A0(x)\cdot B0(z)+A1(x)\cdot B1(z)+A2(x)\cdot B2(z),$$

$$B0(z)=C0\cdot\cos(\beta 0\cdot z),$$

$$B1(z)=C1\cdot\cos(\beta 1\cdot z) \text{ and}$$

$$B2(z)=C2\cdot\cos(\beta 2\cdot z),$$

where B0(z), B1(z) and B2(z) are respective coefficients of the zero-order mode, the first-order mode and the second-order mode at the position of the coordinate z. Each of B0(z), B1(z) and B2(z) varies as a function of the propagation distance and the propagation constant of each mode. C0, C1 and C2 indicate so many constant terms. Note that the coordinate on the silicon substrate 110 is expressed by z=z0. The constant terms (C0, C1, C2) vary as a function of the position where light enters the incident surface 107.

Figure 3B:
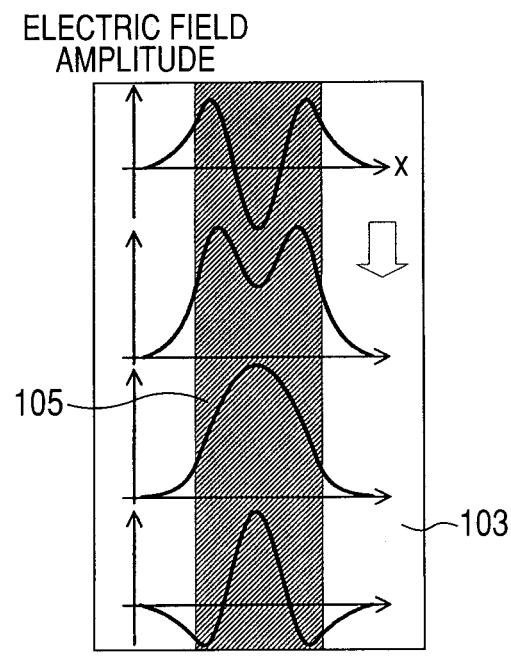
FIGS. 3B and 3C are schematic illustrations of the guided mode for propagation through the optical waveguide according to Embodiment 1 of the present invention.
Figure 3C:
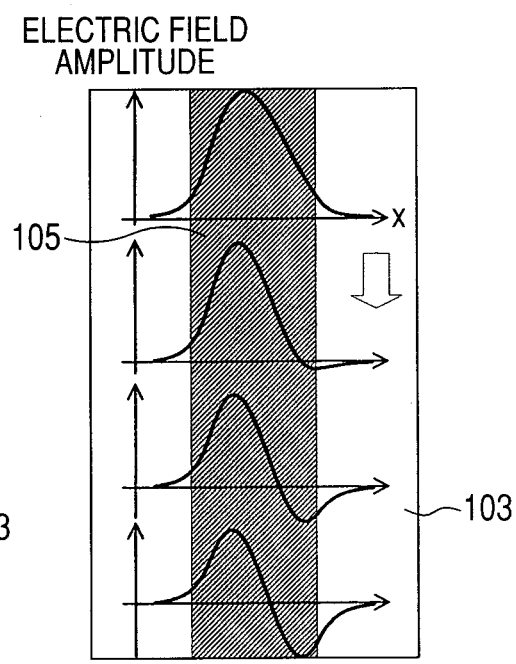

FIGS. 3B and 3C illustrate how the profile of the guided mode varies between when light enters at or near the center of the incident surface 107 (FIG. 3B) and when light enters at or near an end of the incident surface 107 (FIG. 3C) in a conventional structure where only an optical waveguide 106 is provided. Light is assumed to be propagated downward in FIGS. 3B and 3C, which show the electric field amplitudes in the respective cross sections of the optical waveguide 106.

Then, the coefficients of the zero-order mode, the first-order mode and the second-order mode in the electric field amplitude distribution on the silicon substrate surface 110 (z=z0) are B0(z0), B1(z0) and B2(z0) respectively. How light spreads transversally in the inside of the silicon substrate 101 is determined by the ratio of the coefficients. In FIG. 2A, (a) illustrates the spread of light in the inside of the silicon substrate 101 when light of the zero-order mode is distributed on the silicon substrate surface 110. In FIG. 2B, (a) and (b) illustrate the spreads of light in the inside of the silicon substrate 101 when light of the first-order mode and that of the second-order mode are distributed on the silicon substrate surface 110 respectively. From FIGS. 2A and 2B, it will be seen that the spread of light in the transversal direction in the inside of the silicon substrate 101 is suppressed when the zero-order mode is distributed on the silicon substrate surface 110 if compared with the first-order mode and the second-order mode. Thus, it is necessary to raise the ratio of the coefficient B0(z0) of the zero-order mode on the silicon substrate surface 110 (z=z0).

A high ratio can be obtained for the coefficient B0(z0) of the zero-order mode on the silicon substrate surface 110 (z=z0) by selecting an appropriate value for the length of the optical waveguide 106 when the position and the wavelength of light entering from the incident surface 107 are fixed. However, light enters at various positions on the incident surface 107 and light of the wavelengths included in the transmission band of the color filter 111 is propagated. Therefore, a conventional structure where only an optical waveguide 106 is provided cannot realize a high ratio of the coefficient B0(z0) of the zero-order mode on the silicon substrate surface 110. For example, when the spread of the electric field intensity distribution is estimated at a position in the inside of a silicon substrate 101 located 4 µm deep from the silicon substrate surface 110 on an assumption that the x and y directional dimensions of the pixel unit 100 are 1.2 µm, it was found that the spread to adjacent pixels is not less than 40%.

When compared with the conventional structure where only an optical waveguide 106 is provided, the electric field amplitude needs to be distributed with the same sign on the silicon substrate surface 110 in order to suppress the spread of light in the inside of the silicon substrate 101 in the transversal direction. To meet the requirement of distribution with the same sign, the relationship of the coefficients B0(z0), B1(z0) and B2(z0) on the silicon substrate surface 110 (z=z0) needs to satisfy either both the condition (i) and the condition (ii) or both the condition (i) and the condition (iii) shown below. The conditions (i), (ii) and (iii) are listed below.

(i) When the zero-order mode and the first-order mode are compared, the absolute value of the coefficient of the zero-order mode is greater than one and a half times of the absolute value of the coefficient of the first-order mode.

$$|B0(z0)|\geq 1.5\cdot|B1(z0)|$$

Figure 4A:
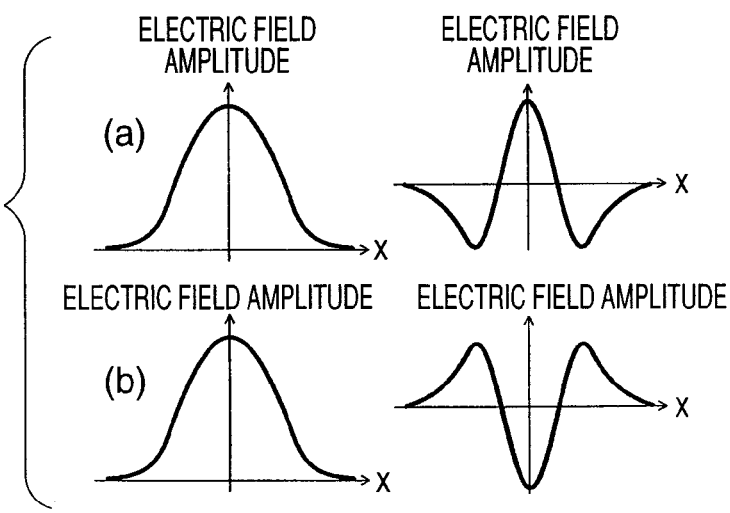
FIG. 4A is a graph illustrating the relationship between the zero-order mode and the second-order mode of Embodiment 1 of the present invention.

(ii) When the zero-order mode and the second-order mode show the relationship as indicated by (a) in FIG. 4A, the absolute value of the coefficient of the zero-order mode is greater than nine times of the absolute value of the coefficient of the second-order mode.

$$B0(z0)\cdot B2(z0)\geq 0 \text{ and}$$

$$|B0(z0)|\geq 9\cdot|B2(z0)|$$

(iii) When the zero-order mode and the second-order mode show the relationship as indicated by (b) in FIG. 4A, the absolute value of the coefficient of the zero-order mode is greater than one and a half times of the absolute value of the coefficient of the second-order mode.

$$B0(z0)\cdot B2(z0)<0 \text{ and}$$

$$B0(z0)|\geq 1.5\cdot|B2(z0)|$$

As for the vector components of the guided mode for propagation through the optical waveguide 106, the components (x, y directions) that are perpendicular to the direction of propagation become large for the higher order mode. Therefore, when light is emitted from the optical waveguide 106 into the inside of the silicon substrate 101, the light is apt to spread in the transversal direction in the inside of the silicon substrate 101 more in the first-order mode and the second-order mode than in the zero-order mode. Thus, the spread of light in the transversal direction is suppressed by the condition (i) for the first-order mode and additionally by the condition (ii) or (iii) for the second-order mode. In other words, to suppress the spread of light in the transversal direction for both the first-order mode and the second-order mode, either both the condition (i) and the condition (ii) or both the condition (i) and the condition (iii) need to be satisfied. Then, the ratio of contribution of the zero-order mode is raised for the electric field amplitude on the silicon substrate surface 110 and the electric field amplitude is distributed either with the positive sign or with the negative sign (with the same sign) by more than 90%. On the other hand, the ratios of contribution of the first-order mode and the second-order mode become large when the above conditions are not satisfied so that the electric field amplitude is distributed in an intermingled state of positive signs and negative signs and light is spread in the transversal direction in the inside of the silicon substrate 101.

The conditions (i) through (iii) can be expressed respectively by (formula 0-1), (formula 0-2) and (formula 0-3) shown below, using propagation constants $\beta 0$, $\beta 1$ and $\beta 2$.

(i) $|C0 \cdot \cos(\beta 0 \cdot z0)| - 1.5 \cdot |C1 \cdot \cos(\beta 1 \cdot z0)| \geq 0$ (formula 0-1)

(ii) $C0 \cdot C2 \cdot \cos(\beta 0 \cdot z0) \cdot \cos(\beta 2 \cdot z0) \geq 0$ and $|C0 \cdot \cos(\beta 0 \cdot z0)| - 9 \cdot |C2 \cdot \cos(\beta 2 \cdot z0)| \geq 0$ (formula 0-2)

(ii) $C0 \cdot C2 \cdot \cos(\beta 0 \cdot z0) \cdot \cos(\beta 2 \cdot z0) < 0$ and $|C0 \cdot \cos(\beta 0 \cdot z0)| - 1.5 \cdot |C2 \cdot \cos(\beta 2 \cdot z0)| \geq 0$ (formula 0-3)

The constant terms (C0, C1, C2) are defined so as to make the electric field amplitude distribution show the same sign on the silicon substrate surface 110 by arranging a mode conversion section 109 in the optical waveguide 106. The position of the lower end of the mode conversion section 109 at the side of the silicon substrate surface 110 is defined to be on the plane of z=0 and the distance from the lower end to the silicon substrate surface 110 is expressed by L (z0=L).

Figure 4B:
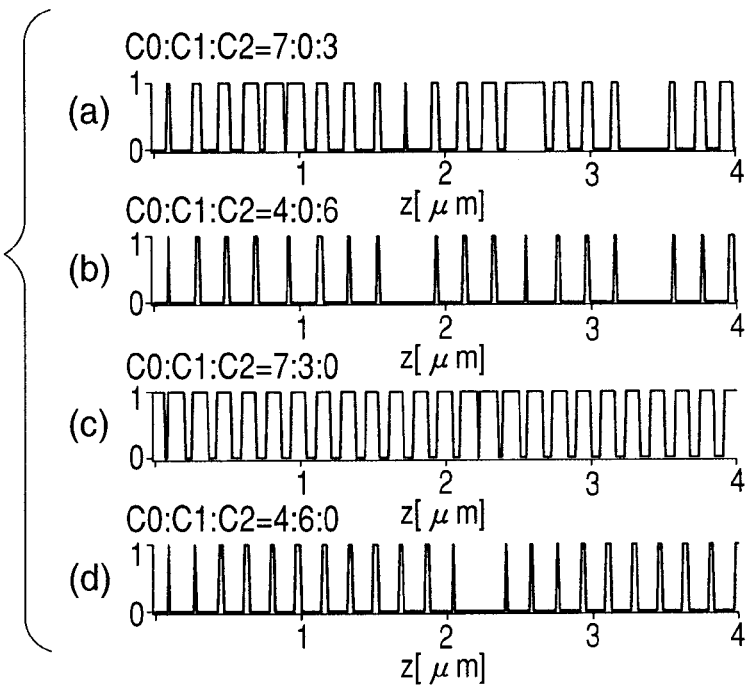
FIG. 4B is a schematic illustration of the scope in which the electric field amplitude distribution according to Embodiment 1 of the present invention illustrates the same sign.

FIG. 4B illustrates how the ranges that satisfy both (formula 0-1) and (formula 0-2) or (formula 0-1) and (formula 0-3) (and where the electric field amplitude distribution shows the same sign on the silicon substrate surface 110) varies with the constant terms (C0, C1, C2). In FIG. 4B, the horizontal axis indicates the propagation distance z (=L), whereas the regions where the electric field amplitude distribution shows the same sign on the silicon substrate surface 110 are found at 1 on the vertical axis and the regions where the electric field amplitude distribution does not show the same sign on the silicon substrate surface 110 are found at 0 on the vertical axis.

FIG. 4B illustrates an instance where the zero-order mode, the first-order mode and the second-order mode are excited with the same phase at the position of z=0. When |C0| becomes small if compared with |C1| and |C2|, the ranges where the electric field amplitude distribution shows the same sign on the silicon substrate surface 110 are narrowed. In such an instance, the distance L between the end of the mode conversion silicon 109 located at the side of the substrate and the silicon substrate surface 110 needs to be defined with an accuracy of tens of several nm. When actually preparing a pixel unit, the position and the profile of the mode conversion structure 112 and the refractive indexes of the core section 105 and the clad section 103 may fluctuate due to preparation errors. Then, they become very sensitive to the distance L to make it difficult to actually prepare an acceptable pixel unit.

Therefore, on the silicon substrate surface 110, the absolute value |C0| of the coefficient of the zero-order mode needs to be large if compared with the absolute values |C1| and |C2| of the coefficients of the higher order mode as shown below.

$|C0| \geq |C1|$ and $|C0| \geq |C2|$.

In view of this condition, (formula 0-1), (formula 0-2) and (formula 0-3) can be expressed respectively as (formula 1), (formula 2) and (formula 3) shown below:

$|\cos(\beta 0 \cdot L)| - 1.5 \cdot |\cos(\beta 1 \cdot L)| \geq 0$ (formula 1), $a \cdot \cos(\beta 0 \cdot L) \cdot \cos(\beta 2 \cdot L) \geq 0$ and $|\cos(\beta 0 \cdot L)| - 9 \cdot |\cos(\beta 2 \cdot L)| \geq 0$ (formula 2) and $a \cdot \cos(\beta 0 \cdot L) \cdot \cos(\beta 2 \cdot L) < 0$ and $|\cos(\beta 0 \cdot L)| - 1.5 \cdot |\cos(\beta 2 \cdot L)| \geq 0$ formula 3)

where a is a value determined by the structure of the mode conversion section 109. The coefficient will be a=1 when the zero-order mode and the second-order mode are excited with the same phase at coordinate z=0, whereas a=−1 when the zero-order mode and the second-order mode are excited with reversed phases at z=0. Then, a=1 if the refractive index of the mode conversion section 109 is higher at and near the central axis than in the surrounding areas because the zero-order mode and the second-order mode are excited with the same phase at z=0, whereas a=−1 if the refractive index of the mode conversion section 109 is lower at and near the central axis than in the surrounding areas because the zero-order mode and the second-order mode are excited with reversed phases at z=0. A conventional structure where only an optical waveguide 106 is provided cannot satisfy the conditional formulas of (formula 1) and (formula 2) or (formula 1) and (formula 3), whereas this embodiment can satisfy the conditions because a mode conversion section 109 is added to the optical waveguide 106.

Now, the guided mode for propagation through the mode conversion section 109 that is formed by arranging a mode conversion structure 112 showing a refractive index lower than the core section 105 at part of the region running along the lateral wall of the core section 105 in the inside of the latter will be described below.

Assume that the normalized frequency of the mode for propagation through the mode conversion section 109 is V and the circle ratio is p. The normalized frequency V is a parameter that is popularly employed when observing an optical waveguide. Also assume that the propagation constant of incident light in vacuum is k0 and the refractive index of the core section of the mode conversion section 109 is n1, while the refractive index of the mode conversion structure 112 is n3 and the width of the core section of the mode conversion section 109 is t. Then, the normalized frequency V can be expressed by the formula shown below.

$$V = \frac{k_0 t}{2} \sqrt{n_1^2 - n_3^2}$$

The normalized frequency V is uniquely determined when the wavelength of the incident light, the refractive indexes n1 and n3 and the width t including those of the mode conversion section 109 are given. The number of eigenmodes for propagation can be specified on the basis of the normalized frequency V. The number of eigenmodes is not greater than m when $V < m \cdot p/2$ (m: integer). Then, the number of eigenmodes of the mode conversion section 109 is made not greater than two to define the profile of the guided mode for propagation through the mode conversion section 109 by arranging the mode conversion section 109 so as to satisfy the requirement of V<p.

Figure 4C:
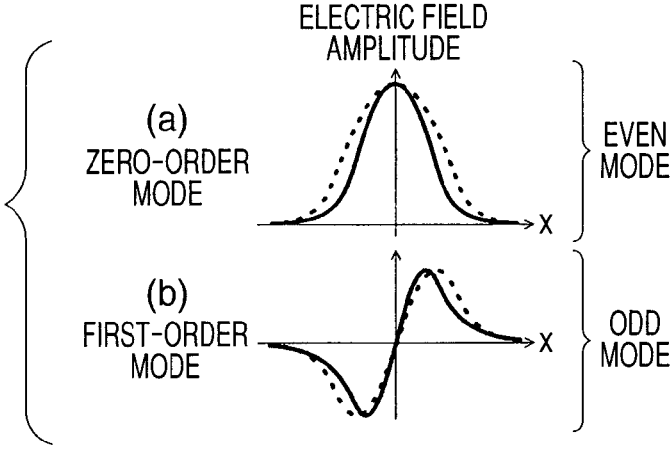
FIG. 4C is a schematic illustration of the eigenmodes of the region where a mode conversion section is added in Embodiment 1 of the present invention.

As an example, the refractive indexes of the core section, the clad section and the mode conversion structure of the mode conversion section are assumed to take the values shown below to describe the guided mode. Namely, the refractive index of the core section of the mode conversion section 109 is 2.02 (SiN), while the refractive index of the clad section 103 is 1.46 ($SiO_2$) and that of the mode conversion structure 112 is 1.46 ($SiO_2$), which is same as that of the clad section 103. In this case, since the mode conversion structure 112 and the clad section 103 are made of the same material, the optical waveguide 106 shows a profile of having a reduced width at part of the core section 105. The core section of the mode conversion section 109 has a width of 400 nm. FIG. 4C illustrates the eigenmodes of the mode conversion section 109. The eigenmodes of the optical waveguide 106 having a width of 600 nm as illustrated in FIG. 3A are also illustrated by broken lines. The normalized frequency is V=0.86p<p. There are two eigenmodes including an even mode and an odd mode on the xz plane. Since the width of the core section is partly reduced, the spread of the eigenmodes is reduced. Thus, the number of eigenmodes is two, including an even mode and an odd mode on the xz plane of the optical waveguide 106 for any light of wavelengths included in the transmission band of the color filter 111 and the guided mode shows a similar profile.

Figure 5A:
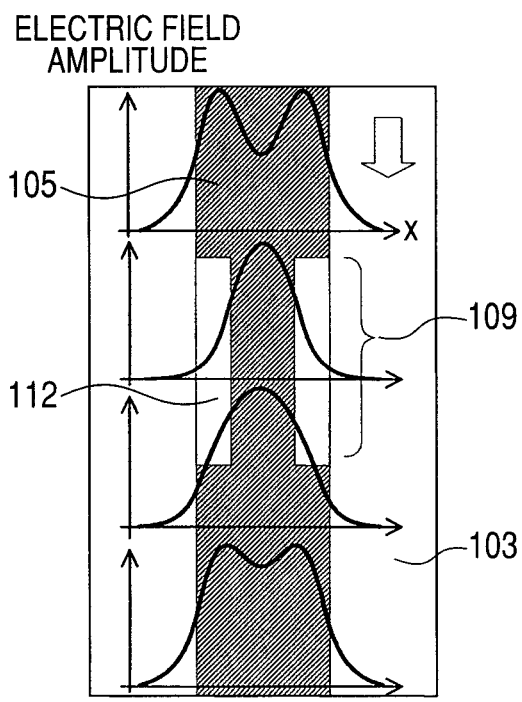
FIGS. 5A and 5B are schematic illustrations of the guided mode for propagation through the optical waveguide where a mode conversion section is added in Embodiment 1 of the present invention.
Figure 5B:
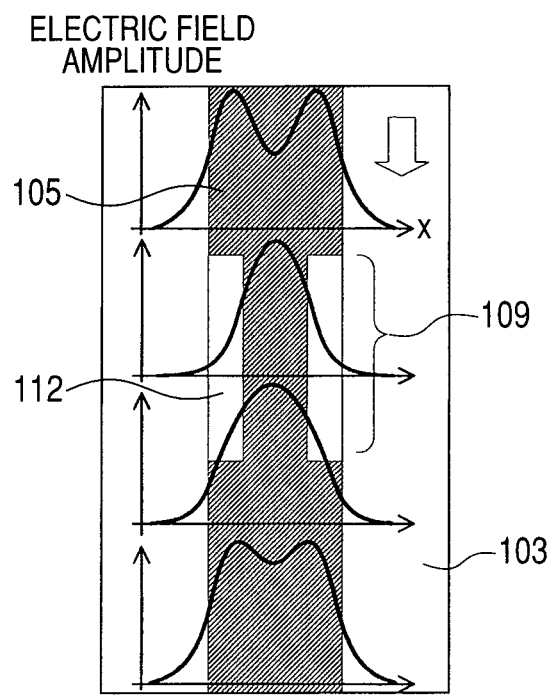

FIGS. 5A and 5B illustrate the guided mode for propagation through the mode conversion section 109 when light enters at or near the center of the incident surface 107 (FIG. 5A) and when light enters at or near an end of the incident surface 107 (FIG. 5B).When light enters at or near the center of the incident surface 107, the even mode is excited for propagation in the optical waveguide 106 in a manner as indicated by (a) and (b) in FIG. 3A. When light gets to the mode conversion section 109, the light is converted into light of the even mode in a manner as indicated by (a) in FIG. 4C and the profile of the guided mode is defined for propagation in a manner as illustrated in FIG. 5A. When, on the other hand, light enters at or near an end of the incident surface 107, the even mode and the odd mode are excited for propagation in the optical waveguide 106 in a manner as indicated by (a), (b) and (c) in FIG. 3A. If the spreading angle is ±20 degrees, which corresponds to camera lens F value of 1.4, and light enters near an end of the incident surface 107, the zero-order mode of the optical waveguide 106 illustrated in FIG. 3A is excited by about 50%. Then, the guided mode is not disturbed to a large extent and light gets to the mode conversion section 109 so that the zero-order mode of the mode conversion section 109 indicated by (a) in FIG. 4C is excited by more than 50%. Then, the profile of the guided mode for propagation through the mode conversion section 109 can be defined as illustrated in FIG. 5B so that the modes in which the electric field is concentrated at and near the optical waveguide 106 can be excited at z=0. As a result, the zero-order mode of the optical waveguide 106 is excited to a large extent at z=0 if compared with the higher order mode to make $C0 \geq C1$ and $C0 \geq C2$. The refractive index of the mode conversion section 109 is greater at and near the central axis thereof than in the surrounding areas. Thus, both the zero-order mode and the second-order mode are excited with the same phase at z=0. Therefore, the coefficient a=1 can be defined in (formula 2) and (formula 3). Then, the conditions of (formula 1) and (formula 2) or those of (formula 1) and (formula 3) can be satisfied to allow the electric field amplitude to be distributed with the same sign on the silicon substrate surface 110.

As described above, light entering from the incident surface 107 can be propagated to the silicon substrate surface 110, while being protected against the crosstalk that arises on the silicon substrate 101, as the light is converted into the guided mode that the optical waveguide 106 possesses and propagated through the core section 105 in a concentrated manner. Additionally, the profile of the guided mode of the optical waveguide 106 is deformed to define a specific profile so as to allow the electric field amplitude distribution on the silicon substrate surface 110 to show the same sign by arranging the mode conversion section 109 in the optical waveguide 106. Note that the normalized frequency of the mode conversion section 109 is so selected as to satisfy the condition of V<p and the distance between the mode conversion section 109 and the silicon substrate surface 110 is so selected as to satisfy the conditions of (formula 1) and (formula 2) or those of (formula 1) and (formula 3). Then, as a result, there is provided a solid-state image sensor that can suppress the crosstalk produced on and in a silicon substrate 101 and shows an excellent color reproducibility and high definition capabilities.

Numerical examples of a solid-state image sensor including an optical waveguide 106 and a mode conversion section 109 will be shown below. In FIGS. 6A and 6B, (a) illustrates the xz plane of the electric field intensity distribution that is observed when light 113 having a wavelength of 650 nm enters the device with a spreading angle of ±20 degrees, which corresponds to camera lens F value of 1.4, at or near the center of the incident surface 107. In FIGS. 6A and 6B, (b) illustrates the electric field amplitude distribution on the silicon substrate surface 110. In FIGS. 6A and 6B, (c) illustrates the electric field amplitude distribution on a plane in the inside of the silicon substrate 101 that is separated from the silicon substrate surface 110 by 4 μm (to be referred to as evaluation plane 114 hereinafter). FIG. 6A illustrates (a) the xz plane of the electric field intensity distribution, (b) the electric field amplitude distribution on the silicon substrate surface 110 and (c) the electric field intensity distribution on the evaluation plane 114 of an arrangement where only an optical waveguide 106 is employed without a mode conversion section 109 added thereto. FIG. 6B illustrates (a) the xz plane of the electric field intensity distribution, (b) the electric field amplitude distribution on the silicon substrate surface 110 and (c) the electric field intensity distribution on the evaluation plane 114 of an arrangement where a mode conversion section 109 is added to a optical waveguide 106.

In FIGS. 6A and 6B, 1.2 μm and 4 μm are selected as examples respectively for the width of the incident surface 107 that corresponds to the width of a single pixel and the distance between the silicon substrate surface 110 and the incident surface 107 that corresponds to the height of a pixel. Additionally, 600 nm is selected for the width of the core section 105 of the optical waveguide 106. Besides, the refractive index and the extinction coefficient of the silicon substrate 101 are respectively assumed to be 4.02 and 0.0164 for a wavelength of 650 nm, whereas the refractive index of the clad section 103 that is made of $SiO_2$ and that of the core section 105 that is made of SiN are respectively assumed to be 1.46 and 2.02. The mode conversion section 109 illustrated in (a) of FIG. 6B are formed by arranging a mode conversion structure 112 so as to be held in contact with part of the lateral wall of the core section 105 in the inside of the latter. The mode conversion section 112 and the clad section 103 are made of the same material, or $SiO_2$ (refractive index: 1.46), and the optical waveguide 106 shows a profile of having a reduced width at part of the core section 105 where the mode conversion section 109 is formed. More specifically, the core section 105 has a width of 400 nm at the position where the core section of the mode conversion section 109 is formed. The optical waveguide 106 and the mode conversion section 109 are symmetric relative to the central axis. Under the above conditions, the normalized frequency of the mode conversion section 109 is V=0.86p<p.

Referring to (a) in FIG. 6B, the distance L between the lower end of the mode conversion section 109 at the side of the silicon substrate 101 and the silicon substrate surface 110 is defined to be L=1.35 μm so as to make the electric field amplitude distribution show the same sign on the silicon substrate surface 110. Then, the conditions of (formula 1) and (formula 3) are satisfied as shown below.

$$|\cos(\beta 0 \cdot L)| - 1.5 \cdot |\cos(\beta 1 \cdot L)| = 0.34 > 0 \quad \text{(formula 1)}$$

$$a \cdot \cos(\beta 0 \cdot L) \cdot \cos(\beta 2 \cdot L) = -0.27 < 0 \text{ and}$$

$$|\cos(\beta 0 \cdot L)| - 1.5 \cdot |\cos(\beta 2 \cdot z 0)| = 0.31 \geq 0 \quad \text{(formula 3)}$$

Note that L may have some other value so long as both the conditions of (formula 1) and (formula 2) or both the conditions of (formula 1) and (formula 3) are satisfied.

As illustrated in (a)s of FIGS. 6A and 6B, both the arrangement of employing only an optical waveguide 106 and the arrangement of employing both an optical waveguide 106 and a mode conversion section 109 can lead light to the silicon substrate surface 110 while suppressing the crosstalk produced on the silicon substrate 101. However, when only an optical waveguide 106 is employed, incident light 113 is converted into the guided mode of the optical waveguide 106 for propagation, while varying its profile in a manner as illustrated in FIG. 3B. Then, the electric field amplitude is distributed on the silicon substrate surface 110 in an intermingled state of positive signs and negative signs as illustrated in (b) of FIG. 6A. To the contrary, when a mode conversion section 109 is added to the optical waveguide 106 as in the case of this embodiment, the profile of the guided mode is deformed to a specific profile for propagation through the mode conversion section 109 as illustrated in FIG. 5A. Then, as illustrated in (b) of FIG. 6B, the electric field amplitude can be distributed with the same sign on the silicon substrate surface 110. Under these conditions, the ratio of the electric field intensity included in the width of 1.2 μm of a single pixel relative to the entire evaluation plane 114 is compared from the electric field intensity distributions illustrated in (c) of FIG. 6A and that of FIG. 6B. The ratio is 57% when only an optical waveguide 106 is employed, whereas the ratio is 79% when a mode conversion section 109 is added. Therefore, the spread of the electric field intensity can be suppressed by adding a mode conversion section 109 if compared with the conventional arrangement of employing only an optical waveguide 106.

Now, the electric field intensity distribution on the xz plane, the electric field amplitude distribution on the silicon substrate surface 110 and the electric field intensity deviation on the evaluation plane 114 will be described in an instance where light 113 strikes the incident surface 107 at a position displaced from the center in the x-direction by 0.3 μm to near a pixel end will be described below. FIG. 7A illustrates (a) the xz plane of the electric field intensity distribution, (b) the electric field amplitude distribution on the silicon substrate surface 110 and (c) the electric field intensity distribution on the evaluation plane 114 of an arrangement where only an optical waveguide 106 is employed without a mode conversion section 109 added thereto. FIG. 7B illustrates (a) the xz plane of the electric field intensity distribution, (b) the electric field amplitude distribution on the silicon substrate surface 110 and (c) the electric field intensity distribution on the evaluation plane 114 of an arrangement where a mode conversion section 109 is added to a optical waveguide 106. As illustrated in (a)s of FIGS. 7A and 7B, both the arrangement of employing only an optical waveguide 106 and the arrangement of employing both an optical waveguide 106 and a mode conversion section 109 can lead light to the silicon substrate surface 110 while suppressing the crosstalk produced on the silicon substrate 101. However, when only an optical waveguide 106 is employed, incident light is converted into the guided mode of the optical waveguide 106 for propagation, while varying its profile in a manner as illustrated in FIG. 3C. Then, the electric field amplitude is distributed on the silicon substrate surface 110 in an intermingled state of positive signs and negative signs as illustrated in (b) of FIG. 7A. To the contrary, when a mode conversion section 109 is added to the optical waveguide 106 as in the case of this embodiment, the profile of the guided mode is deformed by the mode conversion section 109 as illustrated in FIG. 5B. Then, as illustrated in (b) of FIG. 7B, the electric field amplitude can be distributed with the same sign on the silicon substrate surface 110.

Under these conditions, the ratio of the electric field intensity included in the width of 1.2 μm of a single pixel relative to the entire evaluation plane 114 is compared from the electric field intensity distributions illustrated in (c) of FIG. 7A and that of FIG. 7B. The ratio is 55% when only an optical waveguide 106 is employed, whereas the ratio is 70% when a mode conversion section 109 is added. Therefore, the spread of the electric field intensity can be suppressed by adding a mode conversion section 109 if compared with the conventional arrangement of employing only an optical waveguide 106.

This means that the spread of light in the transversal direction in the inside of the silicon substrate 101 can be suppressed by means of the same optical waveguide 106 and the same mode conversion section 109 for any light of wavelengths included in the transmission band of the color filter 111 exactly for the same reason. Likewise, the spread of light in the transversal direction in the inside of the silicon substrate 101 can be suppressed by appropriately selecting the profile, the position and the material of the mode conversion structure 112 regardless if the width and the height of pixels show other values and/or the material of the core section 105 and/or that of the clad section 103 are replaced.

Figure 1B:
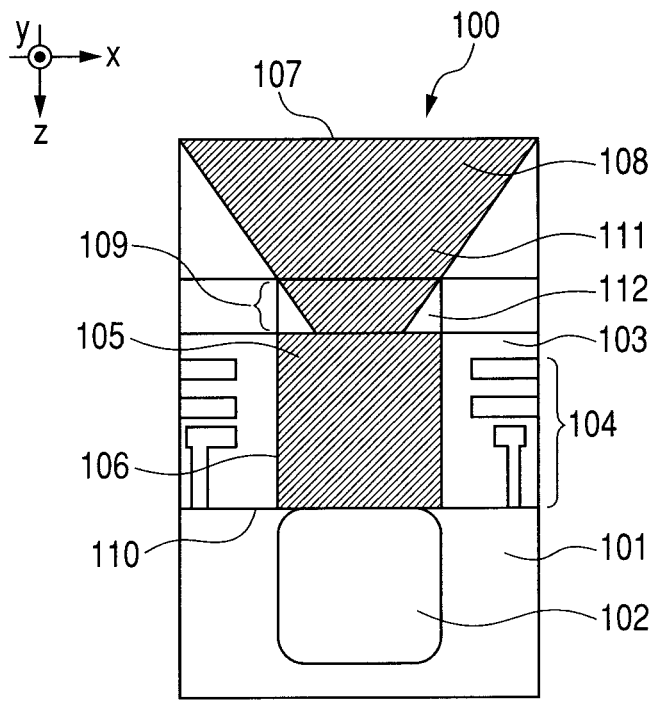

Alternatively, the mode conversion section 109 may be formed by arranging a mode conversion structure 112 that makes the core section partly show a tapered profile as illustrated in FIG. 1B with the width gradually downwardly decreasing. Then, light can be propagated efficiently when the mode conversion section 109 is so formed as to show a profile that agrees with the profile of the tapered light incident section 108 as illustrated in FIG. 1B. If the width of the core section 105 that makes V<p for the optical waveguide 106 is W, the width of the mode conversion section 109 at the lower end thereof located at the side of the optical waveguide 106 is made equal to W. If the distance between the lower end of the mode conversion section 109 and the silicon substrate surface 110 is L, a value that satisfies the conditions of (formula 1) and (formula 2) or those of (formula 1) and (formula 3) is selected for L. With such an arrangement, the electric field amplitude distribution on the silicon substrate surface 110 can be made to show the same sign so as to suppress the crosstalk that arises both on and in the silicon substrate 101. The profile of the core section of the mode conversion section 109 on the xy plane is not limited to rectangular or circle and may alternatively be polygonal such as pentagonal or hexagonal or elliptic.

Figure 8A:
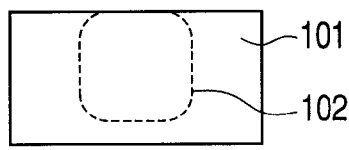
Figure 8B:
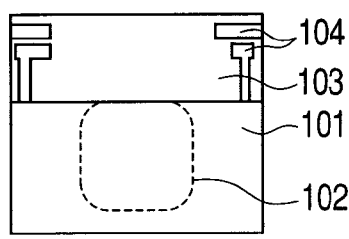

Now, the process of manufacturing a solid-state image sensor that includes a pixel unit 100 of Embodiment 1 will be described below by referring to FIGS. 8A through 8H. It is assumed here that the mode conversion structure 112 is made of a material same as the clad section 103. Firstly, elements (not illustrated) such as a photoelectric conversion section and a transfer gate are formed in predetermined regions in the inside of a silicon substrate 101 (FIG. 8A). Then, an etching stopper film (not illustrated) is formed thereon and subsequently a clad section 103 is formed by using $SiO_2$, while a wiring section 104 is formed at a predetermined position. Then, a planarization process is conducted at the top of the clad section 103 by means of a CMP method or an etching back method (FIG. 8B). Then, after patterning the photoresist on the clad section 103, a recessed section is formed to produce an optical waveguide 106 on the photoelectric conversion section 102 by means of anisotropic etching or some other technique. After removing the resist mask, a core section 105 of SiN is embedded into the recessed section that has been formed typically by means of high density plasma CVD. Then, the surface of the clad section 103 is subjected to a planarization process, using a CMP method or an etching back method (FIG. 8C).

Subsequently, a clad section 103 is laid thereon and a wiring section 104 is formed in a predetermined position of the clad section 103 before the clad section is subjected to a planarization process. Thereafter, the photoresist on the clad section 103 is patterned by means of a lithography technique. Then, a recessed section is formed to form a mode conversion section 109 typically by means of anisotropic etching (FIG. 8D). After removing the resist mask, a mode conversion section 109 of SiN is embedded into the recessed section that has been formed typically by means of high density plasma CVD. Then, a planarization process is conducted to the surface of the clad section 103 by means of a CMP method or an etching back method (FIG. 8E). The recessed section for forming a mode conversion section 109 may alternatively be formed by some other method such as EB drawing or FIB (focused ion beam) processing.

Figure 8C:
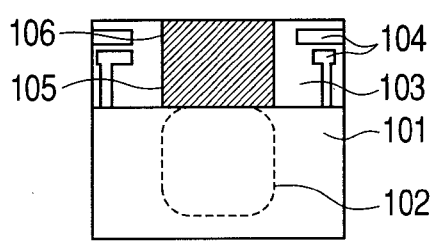
Figure 8D:
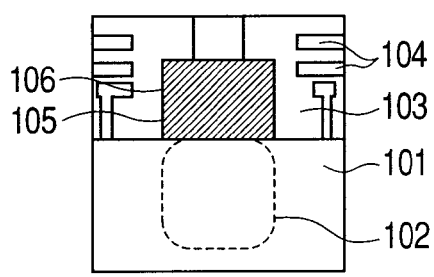
Figure 8E:
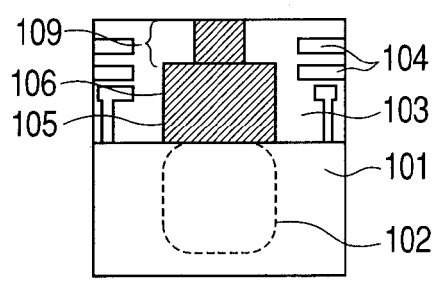
Figure 8F:
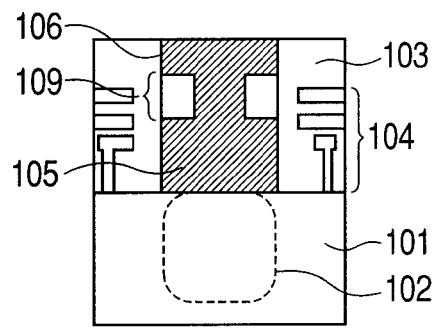
Figure 8G:
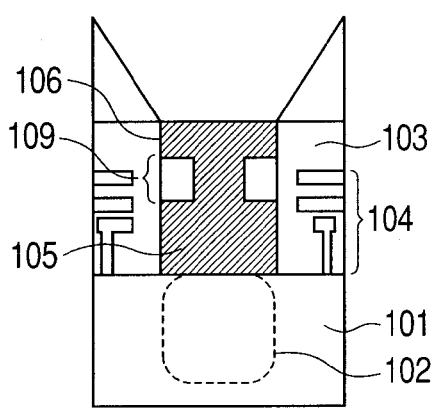
Figure 8H:
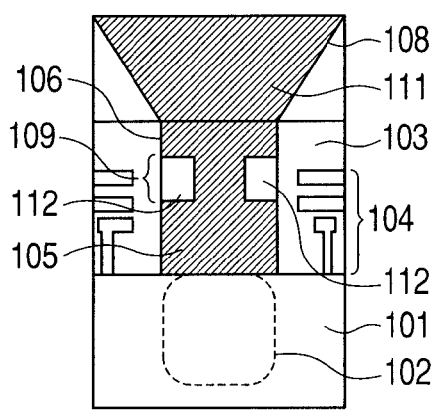

Thereafter, an optical waveguide 106 is formed in a manner as illustrated in FIG. 8C (FIG. 8F). Additionally, a clad section 103 is formed and then an incident section 108 is formed by forming a recessed section showing a tapered profile on the optical waveguide 106 as illustrated in FIG. 8G typically by dry etching and burying the material of a color filter 111 in the inside (FIG. 8H). Note that the mode conversion structure 112 may be formed in a similar manner by using a material different from the clad section 103. In this way, a solid-state image sensor including a pixel unit 100 of Embodiment 1 can be prepared by means of the method described above by referring to FIGS. 8A through 8H.

Thus, as this embodiment, light entering from the incident surface 107 can be converted into the guided mode that the optical waveguide 106 possesses for propagation, while being protected against the crosstalk that arises on the silicon substrate 101, by means of a structure formed by adding a mode conversion section 109 to the optical waveguide 106. Additionally, as light is propagated in the guided mode having a fixed profile by the mode conversion section 109, the electric field amplitude distribution can be made to show the same sign on the silicon substrate surface 110 to suppress the spread of light in the transversal direction in the inside of the silicon substrate 101. Then, as a result, there is provided a solid-state image sensor that can suppress the crosstalk produced on and in a silicon substrate 101 and shows an excellent color reproducibility and high definition capabilities.

The technique of this embodiment is applicable to controlling the propagation of light in other structures such as back illuminated structures and multi-layered structures. The wiring section 104 may not necessarily be formed at the upper side of the silicon substrate 101 that is the side of the incident surface 107. In other words, the wiring section 104 may alternatively be formed at the lower side of the silicon substrate 101. The mode conversion structure 112 of the mode conversion section 109 may not necessarily be held in contact with the inner wall of the core section 105 and it may be made of a material different from the clad section 103. Furthermore, the mode conversion section 109 may be formed alternatively by arranging the mode conversion structure 112 at the outside of the core section 105. While an upper part of the optical waveguide is made to show a tapered profile in this embodiment, the optical waveguide may alternatively show a different profile. The dimensions and the refractive indexes shown for the optical waveguide of this embodiment are by no means limitative. The transmission band of a color filter of a color other than red may be accommodated by selecting the dimensions of the mode conversion silicon 109 on the principle same as the one described above. The color filter may not necessarily be formed in the inside of the incident section. In other words, the color filter may be formed at some other position. Additionally, a structure formed by combining an on-chip lens and a mode conversion section may be adopted without using an optical waveguide. The substrate may not necessarily be made of silicon. The substrate may alternatively be made of some other material. The clad section may not necessarily be made of $SiO_2$. The clad section may alternatively be made of some other material. Finally, the core section may not necessarily be made of SiN. The core section may alternatively be made of some other material.

Embodiment 2

Now, the solid-state image sensor of Embodiment 2 of the present invention will be described below by referring to FIG. 9A. The solid-state image sensor of this embodiment includes a plurality of pixel units 200 arranged in the form of a matrix. The pixel units 200 of this embodiment have a structure that differs from the pixel unit 100 of Embodiment 1 illustrated in FIG. 1A only in terms of the mode conversion section. If the refractive index of the core section 105 is n1 and the refractive index of the clad section 103 is n2, the mode conversion section 201 is formed by arranging a mode conversion structure 202 having refractive index n3 (<n1) that is lower than the core section 105 in the optical waveguide 106. Note that it is sufficient for the mode conversion structure 202 to be made of a material having a refractive index different from the core section 105. It is assumed here that the mode conversion structure 202 has a refractive index lower than that of the core section 105. Assume that the width of the core section 105 of the optical waveguide 105 is d and the width of the mode conversion structure 202 is t (<d). In FIGS. 1A and 9A, the components that are functionally same are denoted by the same reference numerals. The optical waveguide 106 illustrated in FIG. 9A has eigenmodes as illustrated in FIG. 3A for Embodiment 1 and light entering from the incident surface 107 is converted into the guided mode that is expressed by superposing the eigenmodes for propagation. As light is propagated through the core section 105 in a concentrated manner, the light is protected against the crosstalk that arises on the silicon substrate 101.

Now, the guide mode for propagation through the mode conversion section 201 of this embodiment will be described below. Assume here that the normalized frequency of light being propagated through the mode conversion section 201 is V. If the propagation constant of incident light in vacuum is k0, the normalized frequency V can be expressed by the formula shown below.

$$V = \frac{k_0 t}{2} \sqrt{\frac{t}{d} n_1^2 + \frac{d-t}{d} n_3^2 - n_2^2}$$

The normalized frequency V is uniquely determined when the wavelength of the incident light, the refractive indexes n1, n2 and n3 and the widths d and t including those of the mode conversion section 201 are given. Then, the profile of the guided mode for propagation through the mode conversion section 201 can be determined by establishing a relationship of V<p.

Assume here, as an example, that the width of the core section 105 of the optical waveguide 106 is 600 nm and the refractive index of the core section 105 and that of the clad section 103 are respectively 2.02 (SiN) and 1.46 (SiO$_2$). Also assume that the refractive index and the width of the mode conversion structure 202 are respectively 1.46 (SiO$_2$) and 100 nm. Then, the normalized frequency of the mode conversion section 201 will be V=0.98p<p.

FIG. 9B illustrates the eigenmodes of the mode conversion section 201 formed in the above-described manner. Then, there are two eigenmodes including an even mode and an odd mode that exist on the xz plane. The profile of the guided mode is deformed as the refractive index is shifted at and near the central axis. In the instance of FIG. 9B, the guided mode shows such a profile that its amplitude is reduced at and near the center of the guided mode and smaller than the surrounding areas. Thus, the number of eigenmodes is two, including an even mode and an odd mode for any light of wavelengths included in the transmission band of the color filter 111 and the guided mode shows a similar profile. Assume here that the position of the lower end of the mode conversion section 201 at the side of the silicon substrate 101 is defined to be on the plane of z=0 and the distance from the lower end to the silicon substrate surface 110 is expressed by L. Also assume that the propagation constants of the zero-order mode, the first-order mode and the second-order mode of the optical waveguide 106 are respectively β0, β1 and β2.

FIGS. 10A and 10B illustrate the guided mode for propagation through the mode conversion section 201 when light enters at or near the center of the incident surface 107 (FIG. 10A) and when light enters at or near an end of the incident surface 107 (FIG. 10B). When light enters at or near the center of the incident surface 107, the even mode is excited for propagation in the optical waveguide 106 in a manner as indicated by (a) and (b) in FIG. 3A. When light gets to the mode conversion section 201, the light is converted into light of the even mode in a manner as indicated by (a) in FIG. 9B and the profile of the guided mode is defined for propagation in a manner as illustrated in FIG. 10A. When, on the other hand, light enters at or near an end of the incident surface 107, the even mode and the odd mode are excited for propagation in a manner as indicated by (a), (b) and (c) in FIG. 3A. If the spreading angle is ±20 degrees, which corresponds to camera lens F value of 1.4, and light enters near an end of the incident surface 107, the zero-order mode of the optical waveguide 106 illustrated in FIG. 3A is excited by about 50%. Then, the guided mode is not disturbed to a large extent and light gets to the mode conversion section 201 so that the zero-order mode of the mode conversion section 109 indicated by FIG. 9B is excited by more than 50%. Then, the profile of the guided mode for propagation through the mode conversion section 201 can be defined as illustrated in FIG. 10B. As a result, the zero-order mode of the optical waveguide 106 is excited to a large extent at z=0 if compared with the higher order mode. Additionally, in the instance of the mode conversion section 201, its refractive index is smaller at and near the central axis thereof than in the surrounding areas. Thus, the zero-order mode and the second-order mode are excited with the reversed phases at z=0. Therefore, the coefficient a=−1 can be defined in (formula 2) and (formula 3), which are described above for Embodiment 1.

$$|\cos(\beta 0 \cdot L)| - 1.5 \cdot |\cos(\beta 1 \cdot L)| \geqq 0 \quad \text{(formula 1)}$$

$$\cos(\beta 0 \cdot L) \cdot \cos(\beta 2 \cdot L) \geqq 0 \text{ and}$$

$$|\cos(\beta 0 \cdot L)| - 9 \cdot |\cos(\beta 2 \cdot L)| \geqq 0 \quad \text{(formula 2)}$$

$$\cos(\beta 0 \cdot L) \cdot \cos(\beta 2 \cdot L) < 0 \text{ and}$$

$$|\cos(\beta 0 \cdot L)| - 1.5 \cdot |\cos(\beta 2 \cdot L)| \geqq 0 \quad \text{formula 3}$$

Then, the electric field amplitude can be distributed with the same sign on the silicon substrate surface 110 by satisfying the conditions of (formula 1) and (formula 2) or those of (formula 1) and (formula 3). Then, as a result, the spread of light in the transversal direction the inside of the silicon substrate 101 can be suppressed.

As described above, light entering from the incident surface 107 can be converted into the guided mode that the optical waveguide 106 possesses and propagated through the core section 105 in a concentrated manner. Thus, light can be propagated to the silicon substrate surface 110, while being protected against the crosstalk that arises on the silicon substrate 101. Additionally, the profile of the guided mode of the optical waveguide 106 is deformed to define a specific profile so as to allow the electric field amplitude distribution on the silicon substrate surface 110 to show the same sign by arranging the mode conversion section 201 in the optical waveguide 106. Note that the normalized frequency of the mode conversion section 201 is so selected as to satisfy the condition of V<p and the distance between the mode conversion section 201 and the silicon substrate surface 110 is so selected as to satisfy the conditions of (formula 1) and (formula 2) or those of (formula 1) and (formula 3). Then, as a result, there is provided a solid-state image sensor that can suppress the crosstalk produced on and in a silicon substrate 101 and shows an excellent color reproducibility and high definition capabilities.

Numerical examples of a solid-state image sensor comprising an optical waveguide 106 and a mode conversion section 201 will be described below by referring to FIGS. 11A and 11B. In FIG. 11A, (a) illustrates the electric field intensity distribution that is observed when light 113 having a wavelength of 650 nm enters the device with a spreading angle of ±20 degrees, which corresponds to camera lens F value of 1.4, at or near the center of the incident surface 107. In FIG. 11B, (a) illustrates the electric field intensity distribution that is observed when light enters at or near an end (displaced from the center of the incident surface in the x direction by +0.3 μm). In FIGS. 11A and 11B, (b) illustrates the electric field amplitude distribution on the silicon substrate surface 110. In FIGS. 11A and 11B, (c) illustrates the electric field intensity distribution on the evaluation plane 114 in the inside of the silicon substrate 101 that is separated from the silicon substrate surface 110 by 4 μm. In FIGS. 11A and 11B, (c)s also illustrate by broken lines the electric field intensity distribution that is observed when light enters at or near the incident surface 107 and the electric field intensity distribution that is observed when light enters at or near an end of the incident surface 107 in a structure including only an optical waveguide 106 for the purpose of comparison.

FIG. 11A illustrates (a) the xz plane of the electric field intensity distribution, (b) the electric field amplitude distribution on the silicon substrate surface 110 and (c) the electric field intensity distribution on the evaluation plane 114 of an arrangement where only an optical waveguide 106 is employed without a mode conversion section 201 added thereto. FIG. 11B illustrates (a) the xz plane of the electric field intensity distribution, (b) the electric field amplitude distribution on the silicon substrate surface 110 and (c) the electric field intensity distribution on the evaluation plane 114 of an arrangement where a mode conversion section 201 is added to a optical waveguide 106. In FIGS. 11A and 11B, 1.2 μm and 4 μm are selected as examples respectively for the width of the incident surface 107 that corresponds to the width of a single pixel and the distance between the silicon substrate surface 110 and the incident surface 107 that corresponds to the height of a pixel as in the case of Embodiment 1. Additionally, 600 nm is selected for the width of the core section 105 of the optical waveguide 106. The mode conversion section 201 is formed by arranging a mode conversion structure 202 on the central axis of the optical waveguide 106. The mode conversion structure 202 is made to be plate-shaped on the xz plane with a width of 100 nm and a height of 500 nm.

The refractive index and the attenuation coefficient of the silicon substrate 101 are respectively assumed to be 4.02 and 0.0164 for a wavelength of 650 nm, whereas the refractive index of the clad section 103 that is made of SiO$_2$ and that of the core section 105 that is made of SiN are respectively assumed to be 1.46 and 2.02. The mode conversion structure is made of SiO$_2$ with a refractive index of 1.46. The normalized frequency of the mode conversion section 109 is V=0.98p<p. Referring to FIGS. 11A and 11B, the distance L between the lower end of the mode conversion section 201 at the side of the silicon substrate 101 and the silicon substrate surface 110 is defined to be L=480 nm satisfying the conditions of (formula 1) and (formula 2) so as to make the electric field amplitude distribution show the same sign on the silicon substrate surface 110. Then, the conditions of (formula 1) and (formula 3) are satisfied as shown below.

$|\cos(\beta 0 \cdot L)| - 1.5 \cdot |C1 \cdot \cos(\beta 1 \cdot L)| = 0.07 > 0$ (formula 1)

$a \cdot \cos(\beta 0 \cdot L) \cdot \cos(\beta 2 \cdot L) = -0.44 < 0$ and $|\cos(\beta 0 \cdot L)| - 1.5 \cdot |\cos(\beta 2 \cdot L)| = 0.28 \geq 0$ (formula 3)

Note that L may have some other value so long as both the conditions of (formula 1) and (formula 2) or both the conditions of (formula 1) and (formula 3) are satisfied.

As illustrated in (a)s of FIGS. 11A and 11B, both the arrangement of employing only an optical waveguide 106 and the arrangement of employing both an optical waveguide 106 and a mode conversion section 201 can lead light to the silicon substrate surface 110 while suppressing the crosstalk produced on the silicon substrate 101. However, when only an optical waveguide 106 is employed, the electric field amplitude is distributed on the silicon substrate surface 110 in an intermingled state of positive signs and negative signs as illustrated in (b) of FIG. 6A of Embodiment 1. To the contrary, when a mode conversion section 201 is added to the optical waveguide 106 as in the case of this embodiment, the electric field amplitude can be distributed with the same sign on the silicon substrate surface 110 as illustrated in (b)s of FIGS. 11A and 11B. Under these conditions, the ratio of the electric field intensity included in the width of 1.2 μm of a single pixel relative to the entire evaluation plane 114 is compared from the electric field intensity distributions illustrated in (c)s of FIGS. 11A and 11B. In the case where light enters at or near the center, the ratio is 57% when only an optical waveguide 106 is employed, whereas the ratio is 75% when a mode conversion section 201 is added as seen from (c) of FIG. 11A. In the case where light enters at or near an end of a pixel, the ratio is 55% when only an optical waveguide 106 is employed, whereas the ratio is 73% when a mode conversion section 201 is added as seen from (c) of FIG. 11B. Therefore, the spread of the electric field intensity can be suppressed by adding a mode conversion section 201 if compared with the conventional arrangement of employing only an optical waveguide 106. A solid-state image sensor including pixel units 200 of Embodiment 2 can be prepared by way of a manufacturing process similar to the one illustrated in FIGS. 8A through 8H for Embodiment 1.

Thus, light entering from the incident surface 107 can be converted into the guided mode that the optical waveguide 106 possesses for propagation, while being protected against the crosstalk that arises on the silicon substrate 101, by means of a structure formed by adding a mode conversion section 201 to the optical waveguide 106. Additionally, as light is propagated in the guided mode having a fixed profile by the mode conversion section 109, the electric field amplitude distribution can be made to show the same sign on the silicon substrate surface 110 to suppress the spread of light in the transversal direction in the inside of the silicon substrate 101. Then, as a result, there is provided a solid-state image sensor that can suppress the crosstalk produced on and in a silicon substrate 101 and shows an excellent color reproducibility and high definition capabilities. The profile of the mode conversion section 201 on the xy plane is by no means limited to the one illustrated in FIG. 12A and may alternatively be like the one illustrated in FIG. 12B or FIG. 12C. Furthermore, the material of the mode conversion section 201 is by no means limited to SiO$_2$ and may be replaced by some other material or an air hole.

Embodiment 3

The solid-state image sensor of Embodiment 3 of the present invention will be described below by referring to FIG. 13A. The solid-state image sensor of this embodiment includes a plurality of pixel units 300 arranged in the form of a matrix. Unlike the pixel unit 100 of Embodiment 1 illustrated in FIG. 1A, the mode conversion structure 112 of the mode conversion section 109 of the pixel units 300 of this embodiment is made of metal. In FIGS. 1A and 13A, the components having a same function are denoted by a same reference symbols. In this embodiment, the optical waveguide 106 illustrated in FIG. 13A has eigenmodes same as those illustrated in FIG. 3A for Embodiment 1. Light entering the device from the incident surface 107 is converted into the guided mode that is expressed by superposing the eigenmodes for propagation. Light is propagated through the core section 105 in a concentrated manner so as to be protected against the crosstalk that arises on the silicon substrate 101.

Now, the guided mode of this embodiment for propagation through the mode conversion section 301 will be described below. As an example, it is assumed here for the optical waveguide 106 that the core section 105 thereof has a width of 600 nm and a refractive index of 2.02 (SiN), while the clad section 103 thereof has a refractive index of 1.46 (SiO$_2$). Additionally, the mode conversion section 301 is formed by arranging aluminum (Al) that operates as mode conversion structure 302 at part of the lateral wall in the inside of the core section 105 of the optical waveguide 106 so as to make the core section of the mode conversion section 301 show a width of 400 nm. Al shows a refractive index of 1.47 and an attenuation coefficient of 7.79 for a wavelength of 650 nm. From the attenuation coefficient, the penetration depth of an electric field into Al can be estimated to be not greater than 10 nm.

Assume here that the normalized frequency of light being propagated through the mode conversion section 301 is V. Also assume that the propagation constant of incident light in vacuum is k0 and the refractive index of the core section 105 is n1, while the refractive index of the mode conversion structure 302 is n3 and the width of the core section 105 of the mode conversion section 302 is (d−t). Then, the width of the core section that is included in the mode conversion section 301 is t. Thus, the normalized frequency V can be expressed by the formula shown below.

$$V = \frac{k_0 t}{2}\sqrt{n_1^2 - n_3^2}$$

The normalized frequency V is uniquely determined when the refractive indexes n1 and n3 and the width t including those of the mode conversion section 301 are given. Then, the profile of the guided mode can be defined for propagation through the mode conversion section 301 by means of an arrangement that satisfies the requirement of V<p. The normalized frequency is V=0.85p<p in this embodiment.

FIG. 13B illustrates the eigenmodes of the mode conversion section 301 that is arranged in the above-described manner. FIG. 13B also illustrates the guided modes of the optical waveguide 106 having a width of 600 nm as illustrated in FIG. 3A for the purpose of comparison. There are two eigenmodes including an even mode and an odd mode on the xz plane. Since the width of the core section is partly reduced, the spread of the eigenmodes is reduced. Thus, the number of eigenmodes is two, including an even mode and an odd mode for any light of wavelengths included in the transmission band of the color filter 111 and the guided mode shows a similar profile.

Assume here that the position of the lower end of the mode conversion section 301 at the side of the silicon substrate 101 is defined to be on the plane of z=0 and the distance from the lower end to the silicon substrate surface 110 is expressed by L. Additionally, the propagation constants of the zero-order mode, the first-order mode and the second-order mode of the optical waveguide are expressed respectively as β0, β1 and β2. The mode profile on the silicon substrate surface 110 can be made to show the same sign by way of an arrangement that satisfies the conditions of (formula 1) and (formula 2) or those of (formula 1) and (formula 3) on the basis of the principle described above for Embodiment 1. The refractive index at and near the center of the mode conversion section 301 is higher than the refractive index of the areas surrounding the central axis. For this reason, both the zero-order mode and the second-order mode of the optical waveguide 106 are excited with the same phase at z=0 so that the coefficient a is made a=1. Theses (formula 1), (formula 2) and (formula 3) can be expressed as below.

$$|\cos(\beta 0 \cdot L)| - 1.5 \cdot |\cos(\beta 1 \cdot L)| \geq 0 \quad \text{(formula 1)}$$

$$\cos(\beta 0 \cdot L) \cdot \cos(\beta 2 \cdot L) \geq 0 \text{ and}$$

$$|\cos(\beta 0 \cdot L)| - 9 \cdot |\cos(\beta 2 \cdot L)| \geq 0 \quad \text{(formula 2)}$$

$$\cos(\beta 0 \cdot L) \cdot \cos(\beta 2 \cdot L) < 0 \text{ and}$$

$$|\cos(\beta 0 \cdot L)| - 1.5 \cdot |\cos(\beta 2 \cdot L)| \geq 0 \quad \text{(formula 3)}$$

On the basis of the principle described above for Embodiment 1, light entering from the incident surface 107 can be converted into the guided mode that the optical waveguide 106 possesses and propagated through the core section 105 in a concentrated manner. Thus, light can be propagated to the silicon substrate surface 110 while being protected against the crosstalk that arises on the silicon substrate 101. Then, the profile of the guided mode of the optical waveguide 106 is deformed to define a specific profile so as to allow the electric field amplitude distribution on the silicon substrate surface 110 to show the same sign by arranging the mode conversion section 301 in the optical waveguide 106. Note that the normalized frequency of the mode conversion section 301 is so selected as to satisfy the condition of V<p and the distance between the mode conversion section 301 and the silicon substrate surface 110 is so selected as to satisfy the conditions of (formula 1) and (formula 2) or those of (formula 1) and (formula 3). Then, as a result, there is provided a solid-state image sensor that can suppress the crosstalk produced on and in a silicon substrate 101 and shows an excellent color reproducibility and high definition capabilities.

Numerical examples of a solid-state image sensor comprising an optical waveguide 106 and a mode conversion section 301 of this embodiment will be described below by referring to FIGS. 14A and 14B. In FIG. 14A, (a) illustrates the electric field intensity distribution that is observed when light 113 having a wavelength of 650 nm enters the device with a spreading angle of ±20 degrees, which corresponds to camera lens F value of 1.4, at or near the center of the incident surface 107. In FIG. 14B, (b) illustrates the electric field intensity distribution that is observed when light enters at or near an end (displaced from the center of the incident surface in the x direction by +0.3 μm). In FIGS. 14A and 14B, (b) illustrates the electric field amplitude distribution on the silicon substrate surface 110 at that time. Furthermore, (c) illustrates the electric field amplitude distribution on the evaluation plane 114 in the inside of the silicon substrate 101 that is separated from the silicon substrate surface 110 by 4 μm. In FIGS. 14A and 14B, (c)s also illustrate by broken lines the electric field intensity distribution that is observed when light enters at or near the center of the incident surface 107 and the electric field intensity distribution that is observed when light enters at or near an end of the incident surface 107 in a structure including only an optical waveguide 106 for the purpose of comparison. FIG. 14A illustrates (a) the xz plane of the electric field intensity distribution, (b) the electric field amplitude distribution on the silicon substrate surface 110 and (c) the electric field intensity distribution on the evaluation plane 114 of an arrangement where only an optical waveguide 106 is employed without a mode conversion section 301 added thereto. FIG. 14B illustrates (a) the xz plane of the electric field intensity distribution, (b) the electric field amplitude distribution on the silicon substrate surface 110 and (c) the electric field intensity distribution on the evaluation plane 114 of an arrangement where a mode conversion section 301 is added to a optical waveguide 106.

In FIGS. 14A and 14B, 1.2 μm and 4 μm are selected as examples respectively for the width of the incident surface 107 that corresponds to the width of a single pixel and the distance between the silicon substrate surface 110 and the incident surface 107 that corresponds to the height of a pixel as in the case of Embodiment 1. Additionally, 600 nm is selected for the width of the core section 105 of the optical waveguide 106. The mode conversion structure 302 is made of Al so as to be plate-shaped on the xz plane with a width of 100 nm and a height of 500 nm and held in contact with the inner wall of the core section 105. The width of the core section of the mode conversion section 301 is 400 nm. Then, the normalized frequency of the mode conversion section 109 is V=0.85p<p.

The distance L between the lower end of the mode conversion section 301 and the silicon substrate surface 110 is defined to be 1.35 μm. Then, the conditions of (formula 1) and (formula 3) are satisfied as shown below.

$$|\cos(\beta 0 \cdot L)|-1.5 \cdot |\cos(\beta 1 \cdot L)|=0.34>0 \quad \text{(formula 1)}$$

$$a \cdot \cos(\beta 0 \cdot L) \cdot \cos(\beta 2 \cdot L)=-0.27<0 \text{ and}$$

$$|\cos(\beta 0 \cdot L)|-1.5 \cdot |\cos(\beta 2 \cdot z 0)|=0.31 \geq 0 \quad \text{(formula 3)}$$

The refractive index and the attenuation coefficient of the silicon substrate 101 are respectively assumed to be 4.02 and 0.0164 for a wavelength of 650 nm, whereas the refractive index and the attenuation coefficient of Al of the mode conversion structure 302 are respectively assumed to be 1.47 and 7.79. On the other hand, the refractive index of the clad section 103 that is made of $SiO_2$ and that of the core section 105 that is made of SiN are respectively assumed to be 1.46 and 2.02. Referring to (a)s in FIGS. 14A and 14B, the distance L between the lower end of the mode conversion section 301 at the side of the silicon substrate 101 and the silicon substrate surface 110 is defined to be within a range that makes the electric field amplitude distribution show the same sign on the silicon substrate surface 110 and also satisfies the conditions of (formula 1) and (formula 3), or L=1.35 μm. Note that L may have some other value so long as both the conditions of (formula 1) and (formula 2) or both the conditions of (formula 1) and (formula 3)) are satisfied.

As illustrated in (a)s of FIGS. 14A and 14B, both the arrangement of employing only an optical waveguide 106 and the arrangement of employing both an optical waveguide 106 and a mode conversion section 301 can lead light to the silicon substrate surface 110 while suppressing the crosstalk produced on the silicon substrate 101. However, when only an optical waveguide 106 is employed, the electric field amplitude is distributed on the silicon substrate surface 110 in an intermingled state of positive signs and negative signs as illustrated in (b) of FIG. 6A of Embodiment 1. To the contrary, when a mode conversion section 301 is added to the optical waveguide 106, the electric field amplitude can be distributed with the same sign on the silicon substrate surface 110 as illustrated in (b)s of FIGS. 14A and 14B. Under these conditions, the ratio of the electric field intensity included in the width of 1.2 μm of a single pixel relative to the entire evaluation plane 114 is compared from the electric field intensity distributions illustrated in (c)s of FIGS. 14A and 14B. In the case where light enters at or near the center, the ratio is 57% when only an optical waveguide 106 is employed, whereas the ratio is 81% when a mode conversion section 301 is added as seen from (c) of FIG. 14A. In the case where light enters at or near an end of a pixel, the ratio is 55% when only an optical waveguide 106 is employed, whereas the ratio is 68% when a mode conversion section 301 is added as seen from (c) of FIG. 14B. Therefore, the spread of the electric field intensity can be suppressed by adding a mode conversion section 301 if compared with the conventional arrangement of employing only an optical waveguide 106. The mode conversion section 301 may alternatively be formed by arranging metal on the central axis of the optical waveguide 106. If such is the case, the coefficient of (formula 2) and (formula 3) will be a=01. Then, the spread of light in the transversal direction in the inside of the silicon substrate 101 can be suppressed for the reason as described above in terms of principle. A solid-state image sensor including pixel units 200 of this embodiment can be prepared by way of a manufacturing process similar to the one illustrated in FIGS. 8A through 8H for Embodiment 1.

Thus, light entering from the incident surface 107 can be converted into the guided mode that the optical waveguide 106 possesses for propagation, while being protected against the crosstalk that arises on the silicon substrate 101, by means of a structure formed by adding a mode conversion section 301 to the optical waveguide 106. Additionally, as light is propagated in the guided mode having a fixed profile by the mode conversion section 301, the electric field amplitude distribution can be made to show the same sign on the silicon substrate surface 110 to suppress the spread of light in the transversal direction in the inside of the silicon substrate 101. Then, as a result, there is provided a solid-state image sensor that can suppress the crosstalk produced on and in a silicon substrate 101 and shows an excellent color reproducibility and high definition capabilities.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2009-123589, filed May 21, 2009, and No. 2009-166775, filed Jul. 15, 2009 which are hereby incorporated by reference herein in their entirety.

The invention claimed is:

1. A solid state image sensor comprising:
a pixel unit having a substrate including therein a photoelectric conversion section and an optical waveguide arranged on an incident side of the substrate so as to guide an incident light converted into a guided mode of the optical waveguide and being propagated through the optical waveguide to the photoelectric conversion section,
wherein the optical waveguide has a mode conversion section for changing a propagation state of an incident light, and
wherein the image sensor satisfies a requirement of V<p, wherein V is a normalized frequency of the mode conversion section for a wavelength of the incident light and p is the number pi, and also satisfies a requirement of formulas (1) and (2) or of formulas (1) and (3):

$$|\cos(\beta 0 \cdot L)|-1.5|\cos(\beta 1 \cdot L)| \geq 0 \quad (1)$$

$$\alpha \cdot \cos(\beta 0 \cdot L) \cdot \cos(\beta 2 \cdot L) \geq 0 \text{ and}$$

$$|\cos(\beta 0 \cdot L)|-9|\cos(\beta 2 \cdot L)| \geq 0 \quad (2)$$

$$\alpha \cdot \cos(\beta 0 \cdot L) \cdot \cos(\beta 2 \cdot L) < 0 \text{ and}$$

$$|\cos(\beta 0 \cdot L)|-1.5|\cos(\beta 2 \cdot L)| \geq 0 \quad (3)$$

where β0, β1 and β2 are propagation constants or zero-order, first-order and second-order guided modes, respectively, for propagation of the incident light through the optical waveguide at a cross section taken along a central axis of the optical waveguide, L is a distance between a substrate-side end of the mode conversion section and the substrate and a is a factor that is 1 when a refractive index of a portion at and near a central axis is higher than a refractive index of a portion at surrounding areas in the mode conversion section and is −1 when a refractive index of a portion at and near a central axis is lower than a refractive index of a portion at surrounding areas in the mode conversion section.

2. The image sensor according to claim 1, wherein the optical waveguide is formed by a core section embedded inside a clad section arranged on the light incident side of the substrate, a refractive index of the core section is higher than a refractive index of the clad section.

3. The image sensor according to claim 2, wherein the mode conversion section is a member arranged in the core section, a refractive index of the member is different from a refractive index of the core section.

4. The image sensor according to claim 2, wherein the mode conversion section is a section formed by a partial region of the core section, the partial region having a modified width.

5. The image sensor according to claim 3, wherein the mode conversion section is made of a metal.

6. The image sensor according to claim 2, wherein the mode conversion section is formed by arranging a mode conversion structure having a refractive index n3 that is smaller than a refractive index n1 of the core section in an area closer to a lateral wall of the core section than to the central axis of the optical waveguide such that the device satisfies a relation of $$V = \frac{k_0 t}{2}\sqrt{n_1^2 - n_3^2}$$

where t is a width of the core section in the mode conversion section and k0 is a propagation constant of an incident light in vacuum.

7. The image sensor according to claim 2, wherein the mode conversion section is formed by arranging a mode conversion structure having a refractive index n3 that is different from the refractive index n1 of the core section in an area closer to the central axis of the optical waveguide than to a lateral wall of the core section such that the device satisfies a relation of $$V = \frac{k_0 t}{2}\sqrt{\frac{t}{d}n_1^2 + \frac{d-t}{d}n_3^2 - n_2^2}$$

Where k0 is a propagation constant of an incident light in a vacuum, n2 is a refractive index of the clad section, d is a width of the core section not in the mode conversion section, and t is a width of the core section in the mode conversion section.

8. The image sensor according to claim 6, wherein the mode conversion structure of the mode conversion section is made of a metal.

9. The image sensor according to claim 1, wherein the mode conversion section changes a propagation state of an incident light such that the incident light being propagated through the optical waveguide has an electric field amplitude distributed with the same sign at a light incident surface of the substrate.

* * * * *